US012609167B2

(12) United States Patent　　　　(10) Patent No.:　US 12,609,167 B2

Wang　　　　　　　　　　　　　　　(45) Date of Patent:　　Apr. 21, 2026

(54) MEMORY, METHODS OF OPERATING MEMORY, SYSTEMS AND STORAGE MEDIUMS

(71) Applicant: Yangtze Memory Technologies Co., Ltd., Wuhan (CN)

(72) Inventor: Yan Wang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 214 days.

(21) Appl. No.: 18/542,258

(22) Filed: Dec. 15, 2023

(65) Prior Publication Data

US 2025/0078934 A1　Mar. 6, 2025

(30) Foreign Application Priority Data

Sep. 6, 2023　(CN) .......................... 202311153232.6

(51) Int. Cl.
*G11C 16/24*　　　　(2006.01)
*G11C 16/04*　　　　(2006.01)
(Continued)

(52) U.S. Cl.
CPC .......... *G11C 16/24* (2013.01); *G11C 16/0483* (2013.01); *G11C 16/10* (2013.01); *G11C 16/12* (2013.01); *G11C 16/26* (2013.01)

(58) Field of Classification Search
CPC ..... G11C 16/24; G11C 16/0483; G11C 16/10; G11C 16/12; G11C 16/26
See application file for complete search history.

(56) References Cited

U.S. PATENT DOCUMENTS 7,701,766 B2 *　4/2010　Joo ..................... G11C 16/3454
　　　　　　　　　　　　　　　　　　365/185.12
8,873,315 B2 *　10/2014　Joo ..................... G11C 16/3454
　　　　　　　　　　　　　　　　　　365/189.16
(Continued)

FOREIGN PATENT DOCUMENTS

CN　　108074596 A　　5/2018
CN　　113632170 A　　11/2021
(Continued)

OTHER PUBLICATIONS

State Intellectual Property Office of People's Republic of China, "First Examination Opinion Notice," issued in connection with China Patent Application No. 202311153232.6, mailed on Aug. 28, 2025, 16 pages. [English language machine translation included.].

*Primary Examiner* — Amir Zarabian
*Assistant Examiner* — Justin Bryce Heisterkamp
(74) *Attorney, Agent, or Firm* — Hanley, Flight & Zimmerman, LLC

(57)　　　　　　ABSTRACT

This application provides a memory including a peripheral circuit and a memory cell array. The peripheral circuit includes a page buffer including a first bit line connection point, a second bit line connection point, a first switching component and a second switching component. The first bit line connection point and the second bit line connection point are connected to a power terminal via independent precharge circuits respectively, and the first bit line connection point and the second bit line connection point are connected to a latch in the page buffer respectively; the precharge circuit is a circuit for precharging the bit lines by the page buffer; the first switching component connects the first bit line connection point and the second bit line connection point; and the second switching component is (Continued)

located on the precharge circuit corresponding to the second bit line connection point.

20 Claims, 22 Drawing Sheets

(51) Int. Cl.
G11C 16/10 (2006.01)
G11C 16/12 (2006.01)
G11C 16/26 (2006.01)

(56) References Cited

U.S. PATENT DOCUMENTS

| | | | | | |
|---|---|---|---|---|---|
| 2005/0265078 | A1* | 12/2005 | Lee | | G11C 16/10 365/185.18 |
| 2007/0002624 | A1* | 1/2007 | Ju | | G11C 16/08 365/185.12 |
| 2007/0064485 | A1* | 3/2007 | Han | | G11C 16/10 365/185.12 |
| 2007/0171715 | A1 | 7/2007 | Lee | | |
| 2007/0195635 | A1* | 8/2007 | Chen | | G11C 16/26 365/185.12 |
| 2011/0299350 | A1* | 12/2011 | Choi | | G11C 7/12 365/203 |
| 2012/0008417 | A1* | 1/2012 | Choi | | G11C 16/0483 365/185.25 |
| 2013/0051152 | A1* | 2/2013 | Lee | | G11C 16/3418 365/185.18 |
| 2013/0070529 | A1* | 3/2013 | Park | | G11C 16/10 365/185.11 |
| 2013/0163360 | A1* | 6/2013 | Seo | | G11C 16/3445 365/218 |
| 2013/0163365 | A1* | 6/2013 | Lee | | H10D 89/10 365/230.03 |
| 2013/0272081 | A1* | 10/2013 | Lee | | G11C 16/26 365/203 |
| 2013/0308393 | A1* | 11/2013 | Youn | | G11C 16/3481 365/189.011 |
| 2014/0010008 | A1* | 1/2014 | Joo | | G11C 16/3454 365/185.2 |
| 2018/0137900 | A1 | 5/2018 | Kim | | |
| 2021/0005265 | A1* | 1/2021 | Lee | | G11C 16/3468 |
| 2022/0319614 | A1* | 10/2022 | Senoo | | G11C 16/30 |
| 2022/0415370 | A1 | 12/2022 | Chen et al. | | |
| 2022/0415372 | A1 | 12/2022 | Chen | | |
| 2023/0022531 | A1* | 1/2023 | Hsu | | G11C 16/30 |

FOREIGN PATENT DOCUMENTS

| | | |
|---|---|---|
| CN | 113678204 A | 11/2021 |
| CN | 115565582 A | 1/2023 |
| KR | 100724334 B1 | 6/2007 |

* cited by examiner

MEMORY, METHODS OF OPERATING MEMORY, SYSTEMS AND STORAGE MEDIUMS

CROSS REFERENCE TO RELATED APPLICATIONS

This application claims priority to and the benefit of Chinese patent application 202311153232.6 filed on Sep. 6, 2023, which is hereby incorporated by reference in its entirety.

TECHNICAL FIELD

The present application relates to the field of memory technologies, and in particular to memory, methods of operating a memory, systems, and storage mediums.

BACKGROUND

In memory products such as NAND flash, a page buffer is an important circuit for enabling data sensing and storage.

In recent implementation, the page buffer is connected to bit lines in the memory cell array of the memory, enabling the sensing of stored data by sensing/amplifying signals from the bit lines, and the writing of data by controlling voltages of the bit lines.

BRIEF DESCRIPTION OF THE DRAWINGS

In order to more clearly illustrate the technical solutions in the examples of the present application, the drawings that need to be used in the description of the examples will be briefly introduced below. Obviously, the drawings in the following description are only some examples of the present application. For those skilled in the art, other drawings can also be obtained based on these drawings without creative effort.

DETAILED DESCRIPTION

Examples of the present application will be further described in detail below in conjunction with the accompanying drawings.

A computer system according to the examples of the present application may include a host and a memory system. The memory system may include a 3D memory, such as a 3D NAND flash.

Figure 1:
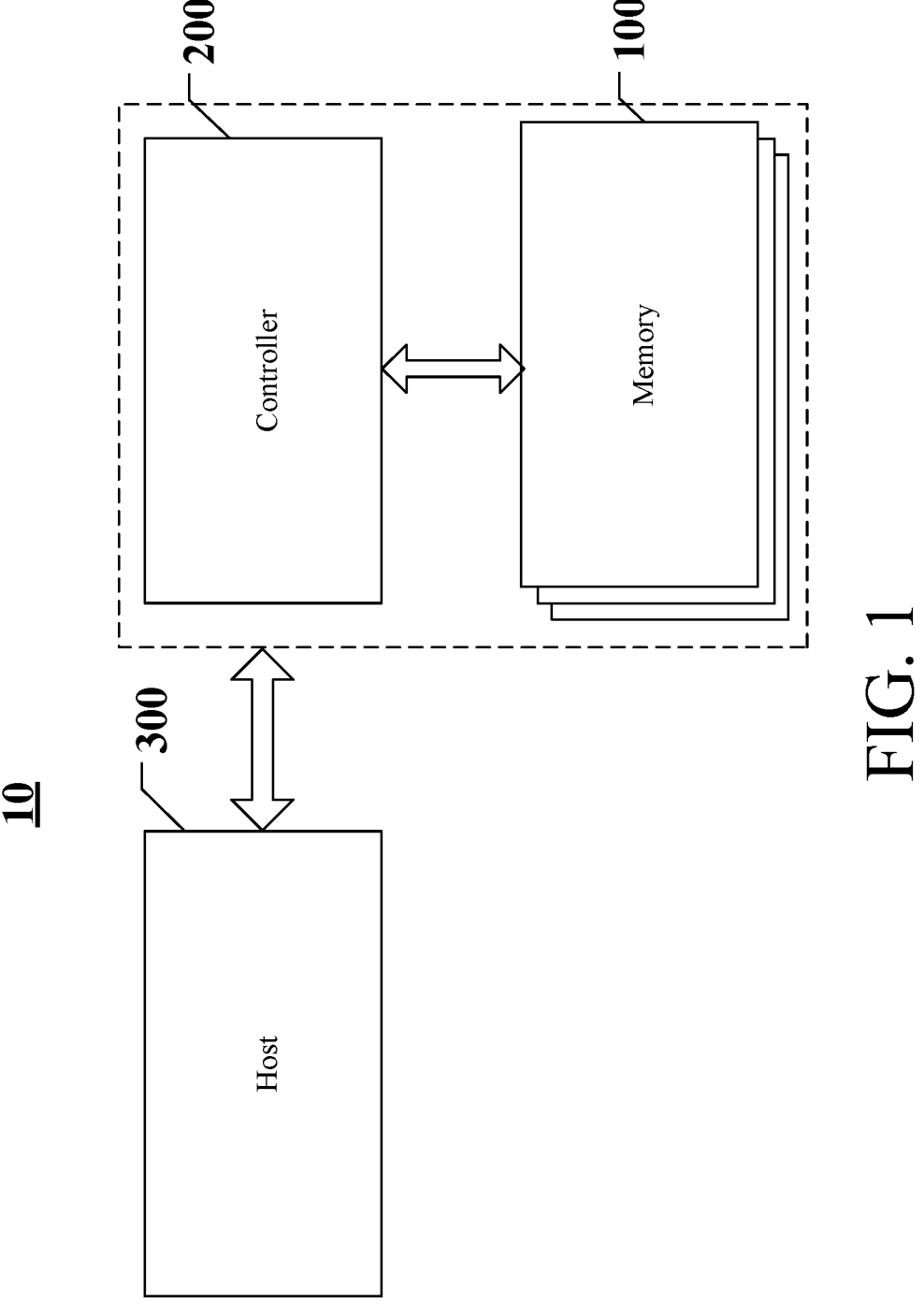
FIG. 1 is a schematic diagram of a computer system according to an example of the present application.

FIG. 1 is a schematic diagram of a computer system provided by an example of the present application. As shown in FIG. 1, the computer system 10 includes one or more memories 100, and a controller 200 coupled to the memory 100 and configured to control the memory 100. The controller 200 may also be referred to as a memory controller.

The controller 200 may be configured to control operations performed by the memory 100, such as read, erase and program operations. The controller 200 may also be configured to manage various functions regarding data stored or to be stored in the memory 100, including but not limited to bad block management, garbage collection, logical to physical address translation, wear leveling, and the like. In some examples, the controller 200 may also be configured to process an Error Correcting Code (ECC) of data read from or written into the memory 100. The controller 200 may also perform any other suitable functions, for example, formatting the memory 100.

The controller 200 can also communicate with external devices according to a specific communication protocol. In some examples, the controller 200 may communicate with external devices via at least one of various interface protocols. The interface protocol can be Universal Serial Bus (USB) protocol, Multi-Media Card (MMC) protocol, Peripheral Component Interconnect (PCI) protocol, PCI-Express (PCI-E) protocol, Advanced Technology Attachment (ATA) protocol, Serial ATA protocol, Parallel ATA protocol, Small Computer System Interface (SCSI) protocol, Enhanced Small Drive Interface (ESDI) protocol, Integrated Development Environment (IDE) protocol, Firewire protocol, etc.

In an example, the controller 200 and one or more memories 100 can be integrated into various types of electronic devices. The electronic device may be a mobile phone, a desktop computer, a laptop computer, a tablet computer, a vehicle computer, a game console, a printer, a pointing device, a wearable electronic device, a smart sensor, a virtual reality (VR) device, an Augmented Reality (AR) device or any other suitable electronic devices having storage therein. In this scenario, as shown in FIG. 1, the computer system 10 further includes a host 300. The controller 200 is coupled to the host 300. The controller 200 may manage data stored in the memory 100 and communicate with the host 300 to implement functions of the aforementioned electronic devices.

In some other examples, the controller 200 and one or more memories 100 may be integrated into various types of storage devices.

Figure 2:
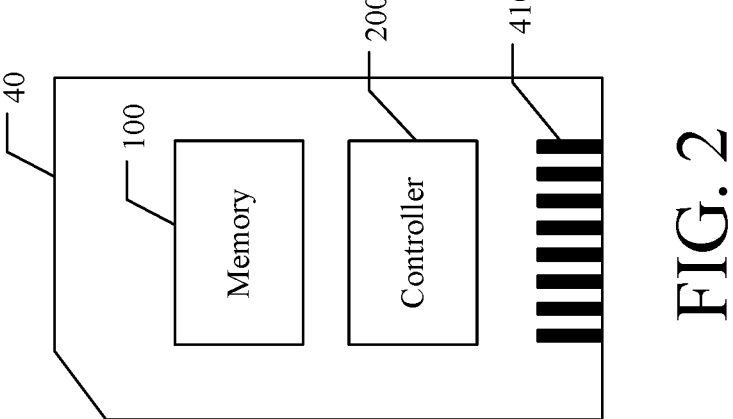
FIG. 2 is a schematic structural diagram of a memory card involved in the present application.

As an example, FIG. 2 is a schematic structural diagram of a memory card involved in the present application. As shown in FIG. 2, the controller 200 and a single memory 100 may be integrated into a memory card 40. The memory card 40 may include a personal computer memory card international association (PCMCIA, PC) card, a Compact Flash (CF) card, a Smart Media (SM) card, a memory stick, a Multi-Media Card (MMC), Reduced-Size MMC (RS-MMC), micro-MMC, Secure Digital (SD) card, Universal Flash Storage (UFS), etc. As shown in FIG. 2, the memory card 40 may further include a connector 410 that couples the memory card 40 with a host.

Figure 3:
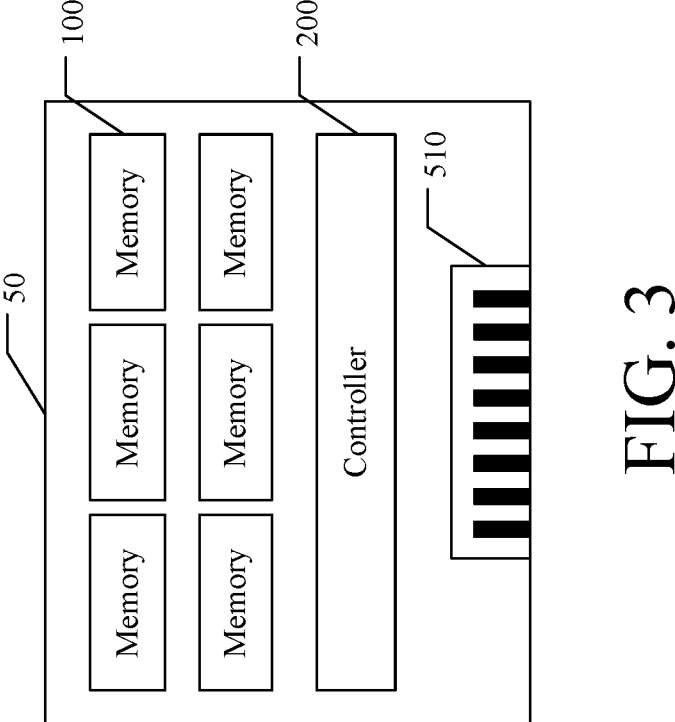
FIG. 3 is a schematic structural diagram of a solid-state drive involved in the present application.

As another example, FIG. 3 is a schematic structural diagram of a solid-state drive involved in the present application. As shown in FIG. 3, the controller 200 and multiple memories 100 may be integrated into a Solid State Disk (SSD) 50. The solid state disk 50 may also include a connector 510 that couples the solid state disk 50 with a host. At least one of storage capacity or operation speed of the solid state disk 50 is greater than that of the memory card 40.

In addition, the memory 100 in FIG. 1 to FIG. 3 may be any memory involved in the examples of the present application, for example, it could be 3D NAND memory. The structure of the memory 100 is explained below.

Figure 4:
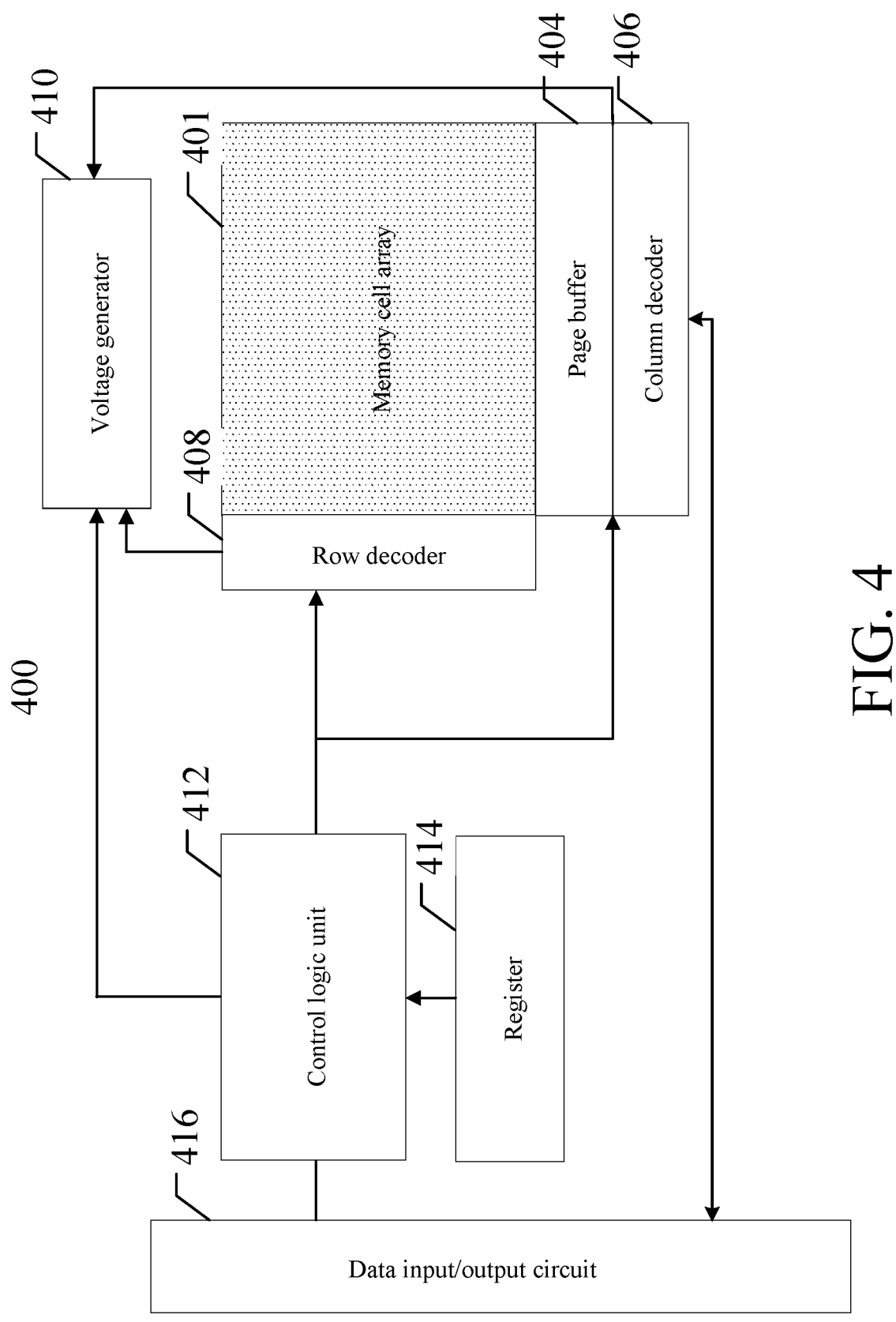
FIG. 4 is a block diagram of a memory shown in an example of the present application.

FIG. 4 is a block diagram of a memory shown in an example of the present application. Referring to FIG. 4, the memory 40 may include a memory cell array 401, a page buffer 404, a column decoder 406, a row decoder 408, a voltage generator 410, a control logic unit 412, a register 414 and a data input/output circuit 416. It should be understood that additional peripheral circuits not shown in FIG. 4 may also be included in some examples.

The page buffer 404 may be configured to read data from and program (write) data to the memory cell array 401 according to a control signal from the control logic unit 412. In one example, the page buffer 404 may store data (write data) to be programmed into a selected page of the memory cell array 401. In another example, the page buffer 404 may output read data during a program verification operation to ensure that the data has been correctly programmed into corresponding memory cells coupled to a selected word line of the memory cell array 401. The column decoder 406 can select one or more NAND memory strings in the memory cell array 401 in response to a control signal provided by the control logic unit. The row decoder can operate in response to a control signal provided by the control logic unit, and select/deselect a selected row of the memory cell array 401. The row decoder may also be configured to supply a voltage generated from the voltage generator 410 to the selected and unselected word lines of the memory cell array 401. As described in detail below, the row decoder/word line driver 408 is configured to perform erase operations on memory cells coupled to one or more selected word lines in the memory cell array 401. The voltage generator 410 may use an external power supply voltage or an internal power supply voltage to generate various voltages required by the memory, such as program voltages, read voltages, pass voltages, verification voltages, bit line voltages, etc., and combinations thereof.

The control logic unit 412 may be coupled to the voltage generator 410, the page buffer 404, the column decoder 406, the row decoder 408, the data input/output circuit 416, etc., and configured to control the operation of various peripheral circuits. The control logic unit may generate operation signals in response to commands or control signals from the memory controller. The register 414 may be coupled to the control logic unit 412 and include a status register, a command register and an address register for storing status information, command operation codes (OP codes) and command addresses for controlling the operation of each peripheral circuit. The data input/output circuit 416 may be coupled to the control logic unit 412 and act as a control buffer to buffer and relay control commands received from a host (not shown) to the control logic unit 412, and to buffer and relay status information received from the control logic unit 412 to the host. The data input/output circuit 416 may also be coupled to the column decoder and act as a data input/output interface and a data buffer to buffer and relay data to or from the memory cell array 401.

Figure 5:
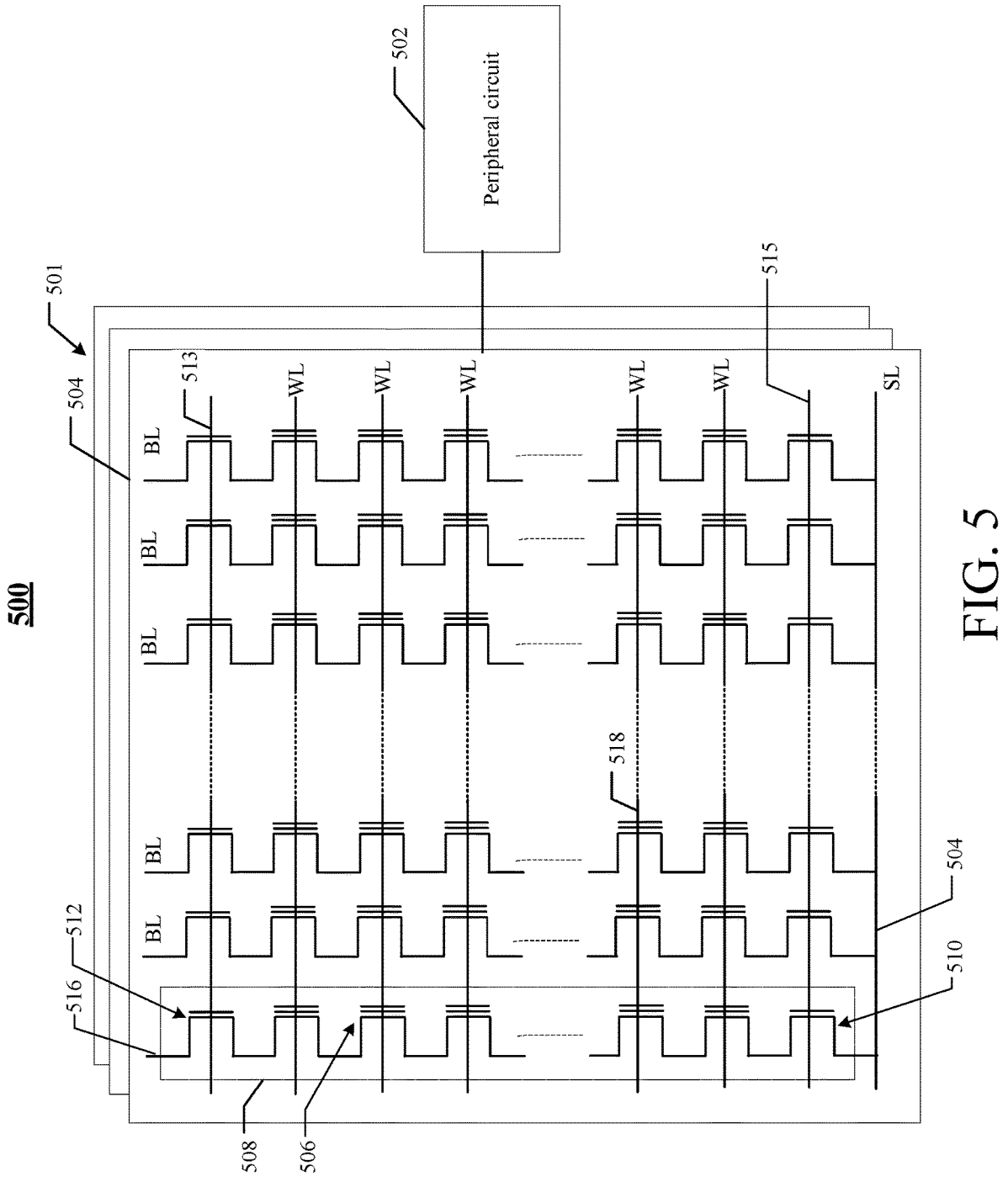
FIG. 5 is a schematic circuit diagram of a memory shown in an example of the present application.

FIG. 5 is a schematic circuit diagram of a memory shown in an example of the present application. As shown in FIG. 5, a memory 500 may include a memory cell array device 501 and a peripheral circuit 502 coupled to the memory cell array device 501. The memory cell array device 501 may be a NAND flash memory cell array in which memory cells 506 are provided in the form of an array of NAND memory strings 508 each extending vertically above a substrate (not shown). In some examples, each NAND memory string 508 includes a plurality of memory cells 506 coupled in series and stacked vertically. Each memory cell 506 can be either a floating gate type of memory cell including a floating-gate transistor or a charge trap type of memory cell including a charge trap transistor. In some examples, each memory cell 506 is a single-level cell (SLC) that has two possible memory states and thus, can store one bit of data. For example, a first memory state "0" can correspond to a first range of voltages, and a second memory state "1" can correspond to a second range of voltages. In some examples, each memory cell 506 is a multi-level cell that is capable of storing more than a single bit of data in more than two memory states, such as two bits per cell (that is, multi-level cell (MLC)), three bits per cell (that is, triple-level cell (TLC)), or four bits per cell (that is, quad-level cell (QLC)).

As shown in FIG. 5, each NAND memory string 508 may include at least one source select transistor 510 at its source end and at least one drain select transistor 512 at its drain end. The source select transistor 510 and drain select transistor 512 may be configured to activate a selected NAND memory string 508 during read and program operations. In some examples, the sources of NAND memory strings 508 in a same block 504 are coupled by a same source line (SL). According to some examples, the drain select transistor 512 of each NAND memory string 508 is coupled to a corresponding bit line 516. In some examples, each NAND memory string 508 is configured to be selected or deselected by at least one of applying a select voltage or a deselect voltage (e.g., 0 V) to respective drain select transistor 512 through one or more drain selection lines 513 or applying a select voltage or a deselect voltage (e.g., 0 V) to respective source select transistor 510 through one or more source select lines 515.

As shown in FIG. 5, a memory cell array may include multiple blocks. In some examples, each block 504 is the basic data unit for an erase operation. That is, all memory cells 506 on the same block 504 are erased simultaneously.

Figure 6:
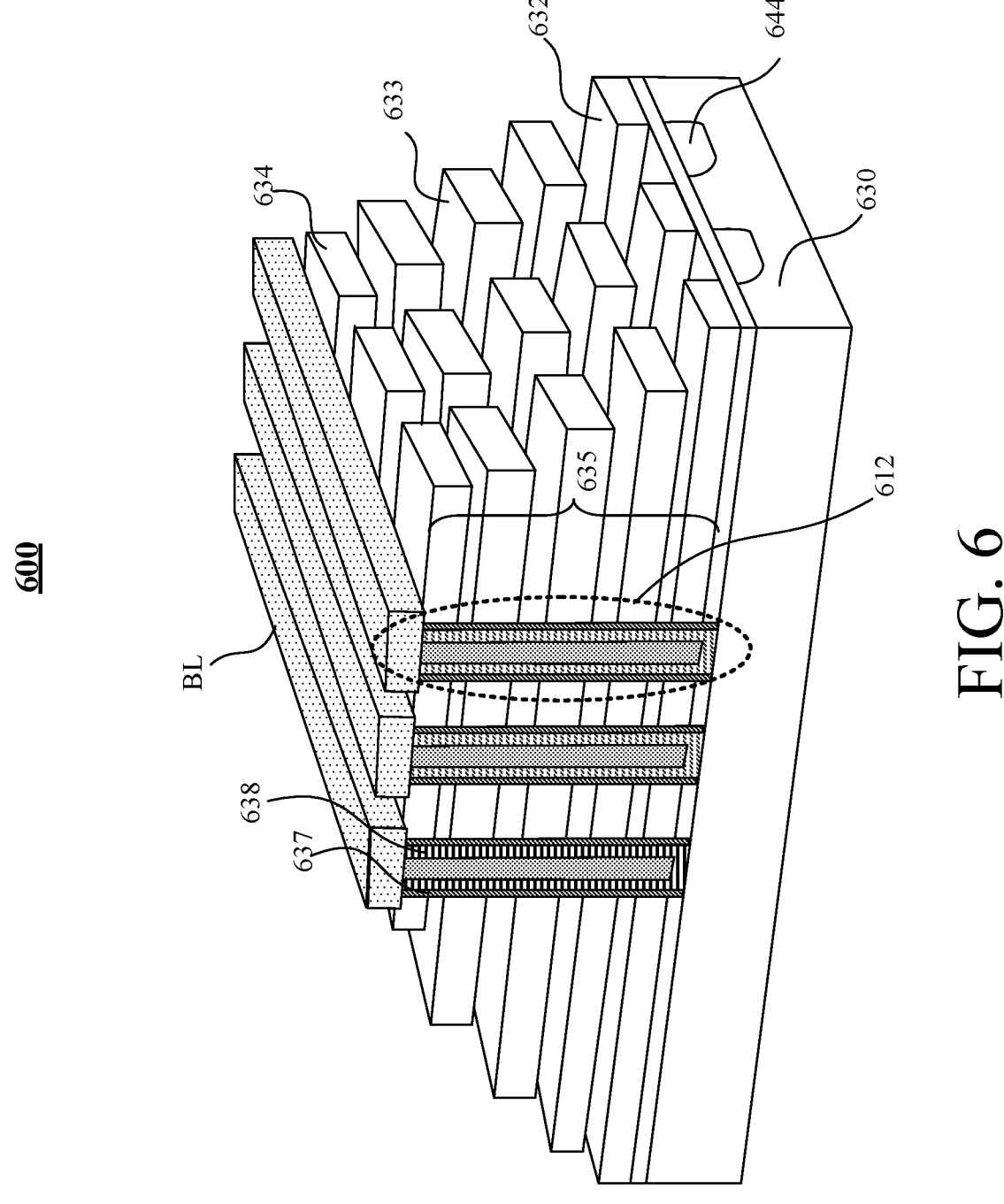
FIG. 6 is a perspective view of a part of a three-dimensional memory array structure shown in an example of the present application.

FIG. 6 is a perspective view of a part of a three-dimensional memory array structure shown in an example of the present application. The memory cell array structure 600 includes a substrate 630 and a stack structure above the substrate 630. The stack structure includes alternately stacked gate conductive layers and interlayer dielectric layers. The substrate 630 may include silicon (e.g., monocrystalline silicon), silicon germanium (SiGe), gallium arsenide (GaAs), germanium (Ge), silicon-on-insulator (SOI), germanium-on-insulator (GOI), or any other suitable materials. The gate conductive layer may include a conductive material including, but not limited to, tungsten (W), cobalt (Co), copper (Cu), aluminum (Al), polysilicon, doped silicon, silicide, or any combination thereof. In some examples, each gate conductive layer includes a metal layer, such as a tungsten layer. In some examples, each gate conductive layer includes a doped polysilicon layer. The gate conductive layer may include a plurality of word lines 633, at least one source select line 632 and at least one drain select line 634.

As shown in FIG. 6, the memory cell array 600 includes a plurality of channel structures 612 extending vertically through a memory stack structure 635. In some examples, the channel structure 612 includes a memory film 637 and a channel 638. As shown in FIG. 6, according to some examples, a well 644 (e.g., at least one of a P-well or an N-well) is formed in the substrate 630, and the source terminals of the memory cell array are in contact with the well 644. It should be understood that although not shown in FIG. 6, additional components of the memory cell array 600 may be formed, including but not limited to gate line slits/source contacts, local contacts, interconnect layers, and the like.

Reference may be made to the descriptions of the computer system examples and method examples of the present application for understanding the technical details not disclosed in the above memory-related hardware examples.

Figure 7:
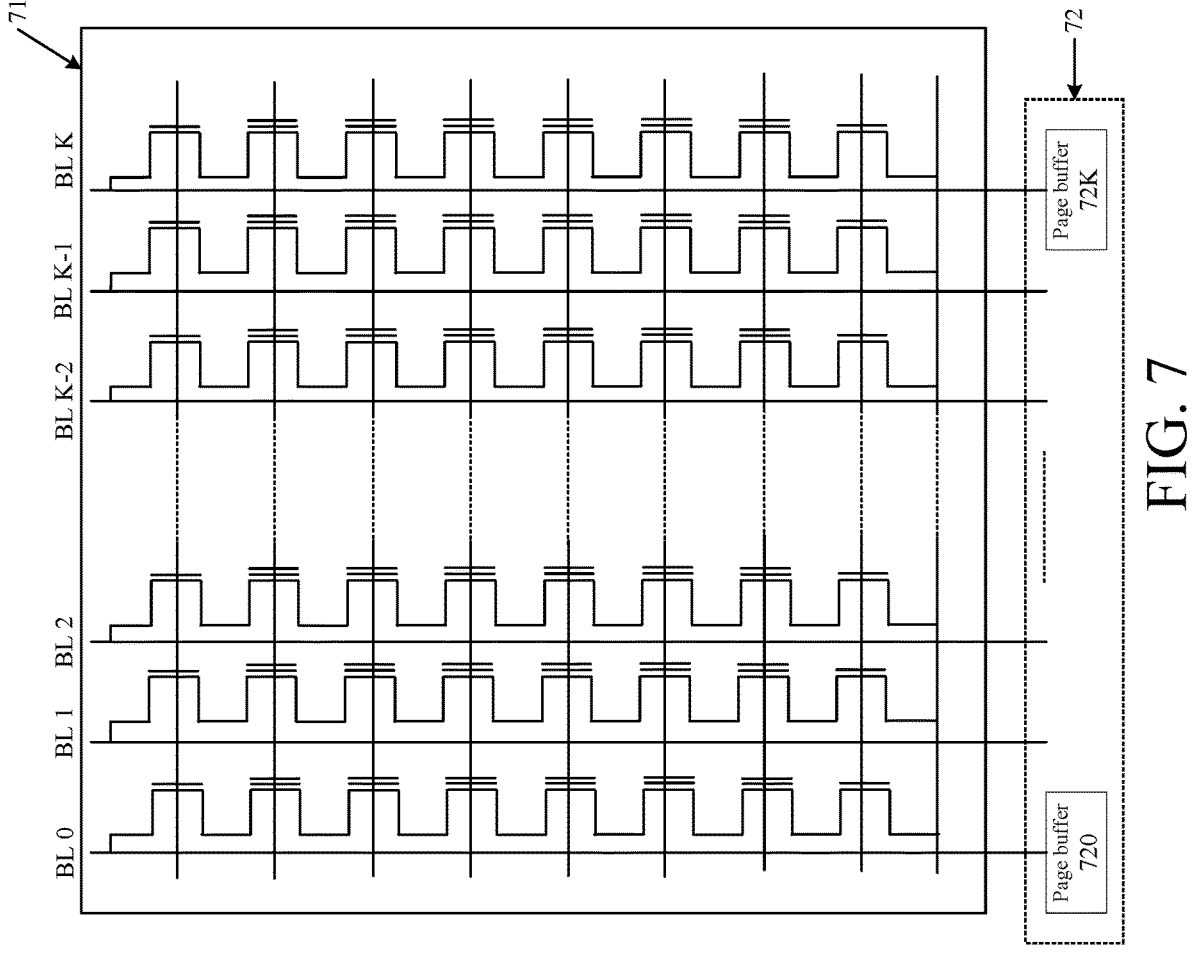
FIG. 7 is a schematic diagram of a connection between a memory cell array and a page buffer of a NAND flash.

Referring to FIG. 7, a schematic diagram of a connection between a memory cell array and a page buffer of a NAND flash is shown. As shown in FIG. 7, the memory cell array 71 includes several bit lines, namely BL 0 to BL K. Correspondingly, the page buffer 72 includes K+1 page buffers, namely page buffer 720 to page buffer 72K, wherein each bit line is connected to an independent page buffer.

Figure 8:
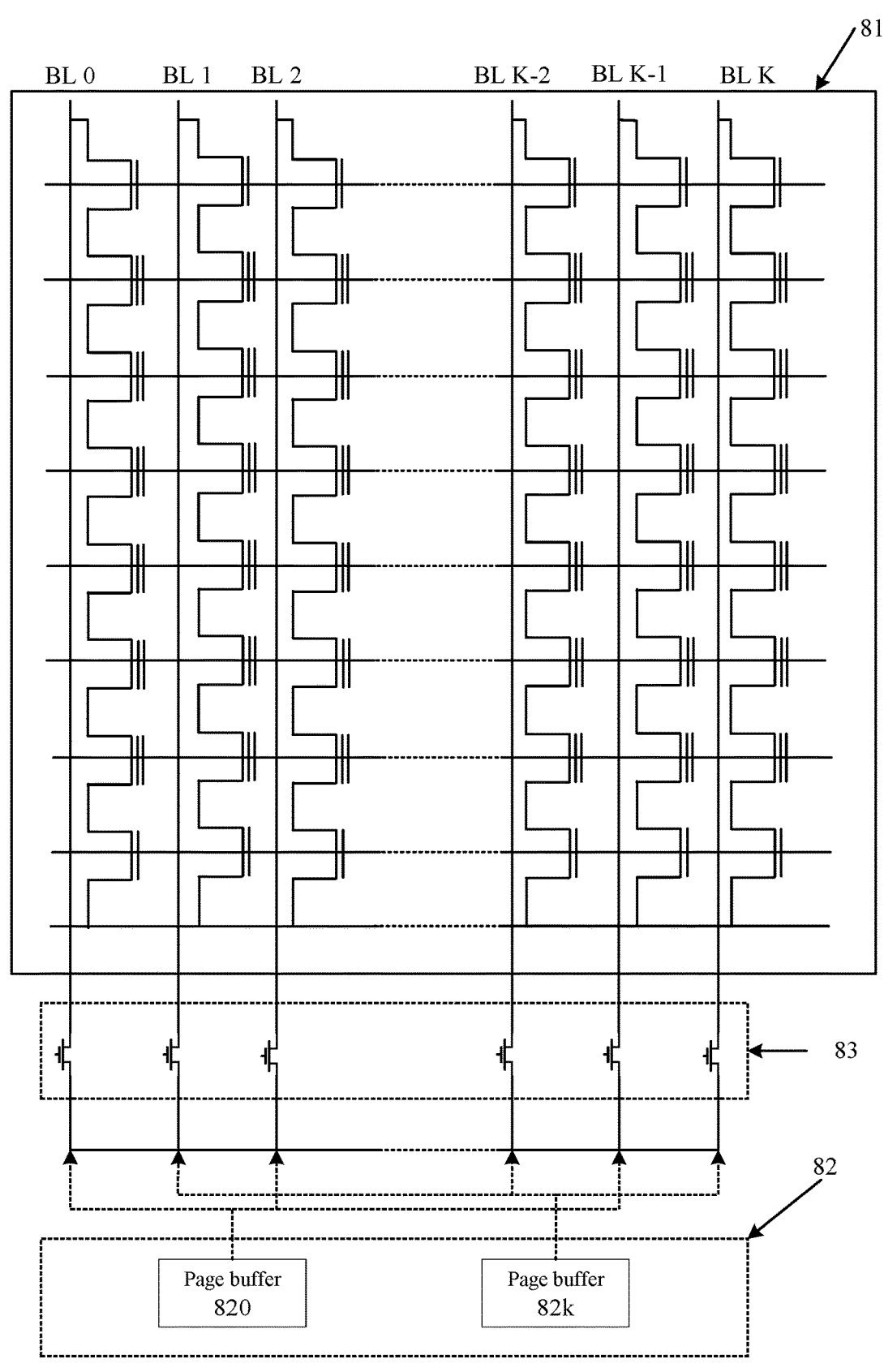
FIG. 8 is a schematic diagram of a connection between a memory cell array and a page buffer of another NAND flash.

Referring to FIG. 8, a schematic diagram of a connection between a memory cell array and a page buffer of another NAND flash is shown. As shown in FIG. 8, the memory cell array 81 includes several bit lines, namely BL 0~BL K, and the page buffer 82 includes k+1 page buffers, namely page buffer 820 to page buffer 82k, wherein the value of k is smaller than the value of K. In the structure shown in FIG. 8, the bit lines BL[0-K] are connected to the page buffers through the switching component 83. Compared with the architecture shown in FIG. 7, the number of the page buffers can be reduced. For example, two or more bit lines can be connected to the same page buffer, which reduces the number of page buffers used. The NAND shown in FIG. 8 can also be referred to as an X-NAND.

In the NAND flash shown in FIG. 7 or FIG. 8, each page buffer has only one bit line connection point. On the other hand, for multiple bit line connection points, a page buffer needs to be provided respectively. However, due to the large circuit size of page buffers, which occupy about 20% to 40% of the size of a die, the number of page buffers in NAND flash is limited, which affects the capacity and performance of NAND flash. For example, when the number of page buffers is limited, it will limit the number of bit lines connected to the page buffers, thereby limiting the storage capacity of NAND flash. In addition, when the number of page buffers is limited, the concurrency of the programming process is limited, thereby limiting the write speed of NAND flash.

In this regard, the solutions illustrated in subsequent examples of the present application provide a new circuit structure of the page buffer and an operation method based on that circuit structure, which can reduce the overall size of the page buffer in the memory while the number of bit lines in the memory remains unchanged, and increase the number of bit lines in the memory while the mold size of the memory remains unchanged.

Figure 9:
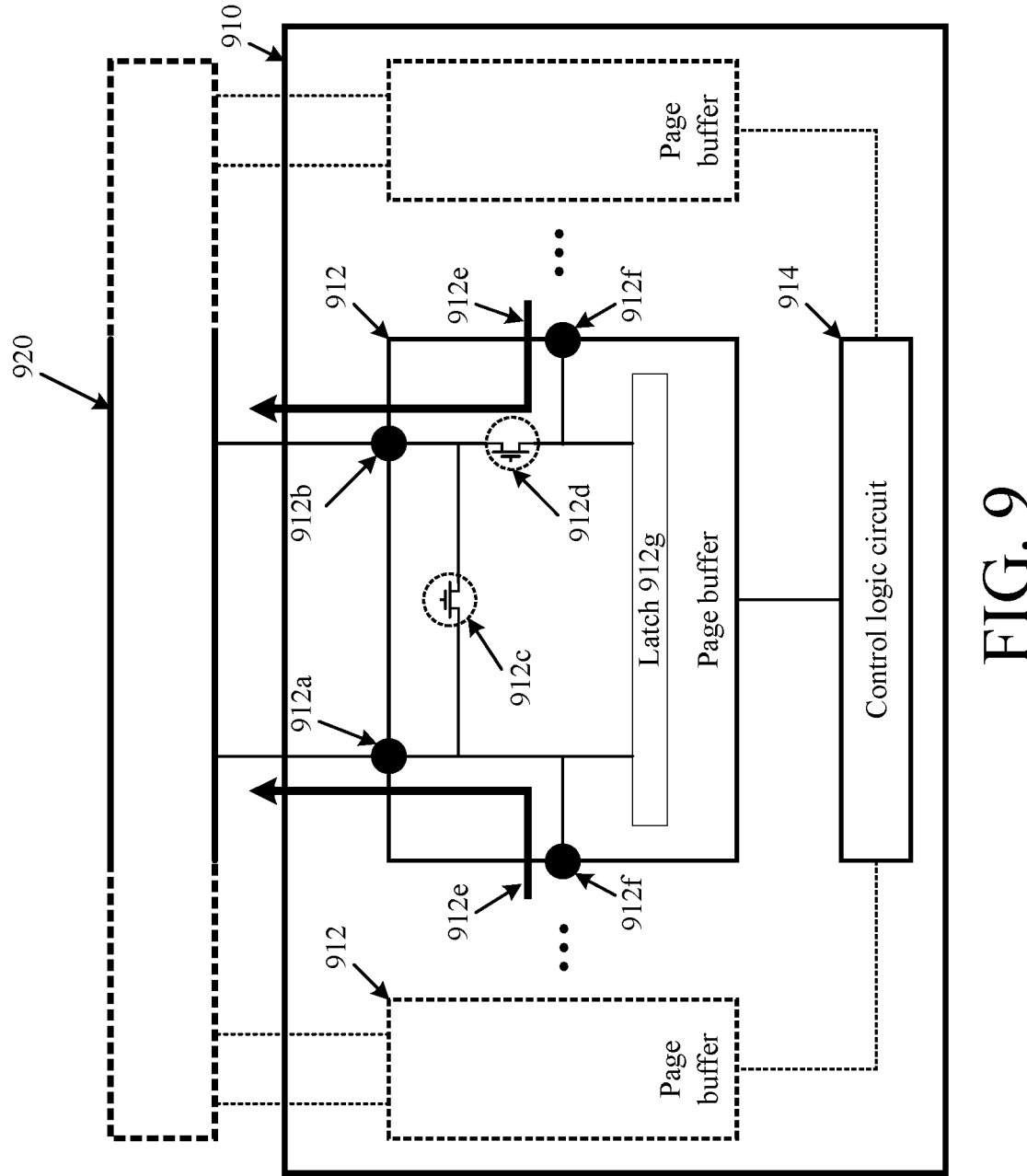
FIG. 9 is a framework diagram of a memory provided by an example of the present application.

With reference to FIG. 9, a framework diagram of a memory provided by an example of the present application is shown. The memory may be the memory 100 in the system 10 as shown in FIG. 1, or may be the memory 400 or the memory 500 as shown in FIG. 4 or FIG. 5. As shown in FIG. 9, the memory includes a peripheral circuit 910 and a memory cell array 920.

As shown in FIG. 9, the peripheral circuit 910 includes a plurality of page buffers 912 and a logic control circuit 914 coupled to the plurality of page buffers 912 and configured to control the plurality of page buffers 912.

The page buffer 912 includes a first bit line connection point 912a, a second bit line connection point 912b, a first switching component 912c, and a second switching component 912d, as shown in FIG. 9.

The above-mentioned bit line connection point refers to a point at which the page buffer 912 is connected to the bit line BL.

The above-mentioned first switching component 912c and the second switching component 912d may be a Metal Oxide Semiconductor Field Effect Transistor (MOSFET), which may be referred to as MOS transistors for short.

As shown in FIG. 9, the first bit line connection point 912a and the second bit line connection point 912b are to connect bit lines in the memory cell array 920; the first bit line connection point 912a and the second bit line connection point 912b are connected to a power terminal 912f via independent precharge circuits 912e respectively, and the first bit line connection point 912a and the second bit line connection point 912b are connected to a latch 912g in the page buffer 912 respectively; the precharge circuit 912e is a circuit for precharging the bit lines by the page buffer 912.

As shown in FIG. 9, the first switching component 912c is to connect the first bit line connection point 912a and the second bit line connection point 912b. The second switching component 912d is located on the precharge circuit 912e corresponding to the second bit line connection point 912b.

To sum up, according to the solution shown in the example of the present application, for the plurality of page buffers in a peripheral circuit of a memory, each page buffer comprises two bit line connection points with independent precharge circuits, and the two bit line connection points are connected to bit lines in the memory cell array and a latch in the page buffer respectively. Meanwhile, the two bit line connection points are also connected through a first switching component, and a second switching component is also located on the precharge circuit of one of the bit line connection points. In the above scheme, the two bit line connection points in the page buffer can share a part of the circuit structure in the page buffer when the bit lines are respectively precharged during a program operation. For example, in a precharge stage during the program operation, the first switching component is turned off while the second switching component is turned on, so that the two bit line connection points precharge the bit line via their respective precharge circuits. During a read operation, the second switching component is turned off, and the reading of memory cells coupled to any of the two bit lines is enabled through the turning on of the first switching component, whereby the two bit line connection points share a sensing part of the circuit structure. With the above solution, two or more bit line connection points can be integrated into a page buffer and share a part of the circuit structure in the page buffer. There is no need to provide a page buffer for each bit line connection point, which can reduce the overall size of the page buffer in the memory while the number of bit lines in the memory remains unchanged, and increase the number of bit lines in the memory while the mold size of the memory remains unchanged, thereby improving storage capacity and performance.

In the circuit structure shown in FIG. 9, a page buffer 912 includes two bit line connection points. In an example, based on the circuit structure shown in FIG. 9, a page buffer 912 can also include more than two bit line connection points. For example, a page buffer 912 may include one first bit line connection point 912a and two or more second bit line connection points 912b.

Figure 10:
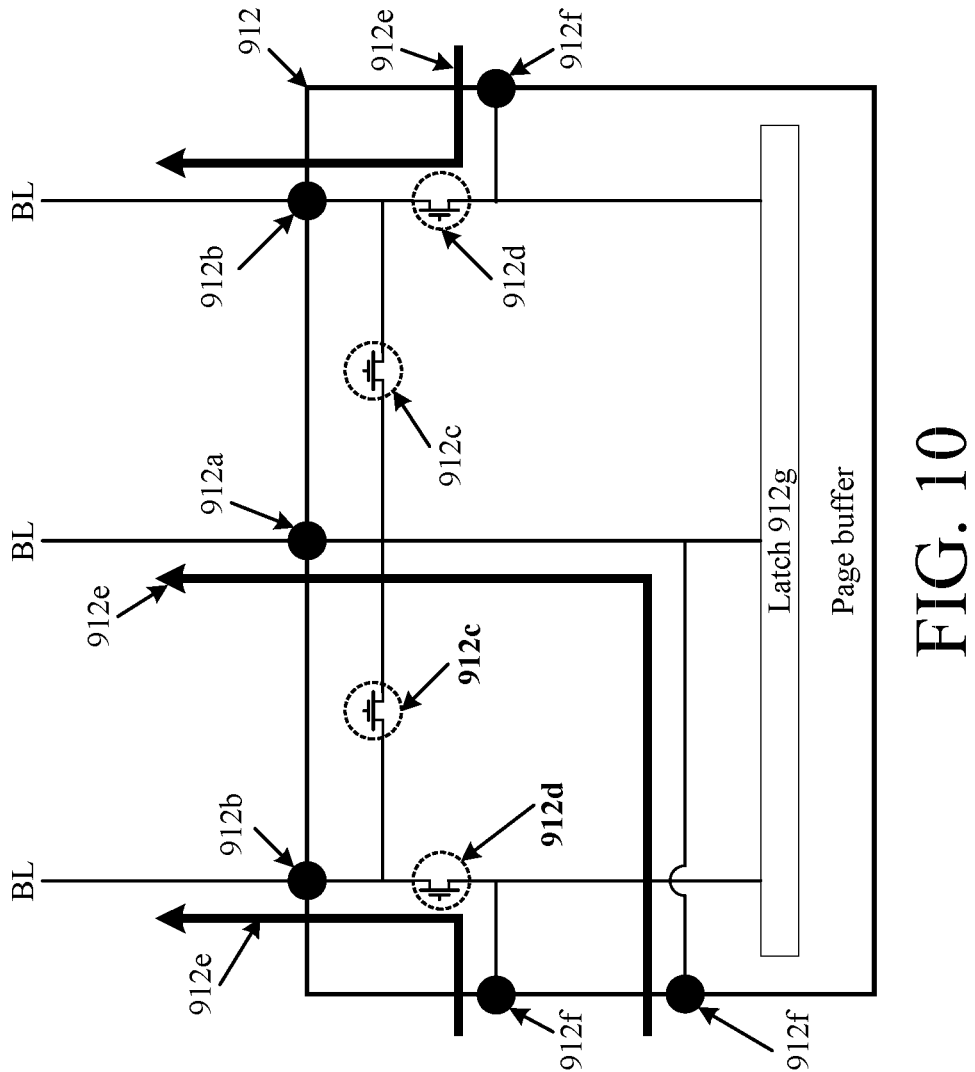
FIG. 10 is a schematic structural diagram of a page buffer involved in an example of the present application.

For example, based on the circuit structure shown in FIG. 9, taking a page buffer 912 including one first bit line connection point 912a and two second bit line connection points 912b as an example, the schematic structural diagram of a page buffer involved in an example of the application is shown with reference to FIG. 10. As shown in FIG. 10, a page buffer 912 includes one first bit line connection point 912a and two second bit line connection points 912b, and the two second bit line connection points 912b are connected to the first bit line connection point 912a through a first switching component 912c respectively (that is, there are two first switching components 912c). The two second bit line connection points 912b and the first bit line connection point 912a have independent precharge circuits (that is, there are three independent precharge circuits), and the precharge circuits 912e corresponding to the two second bit line connection points 912b each have a second switch component 912d (that is, there are two second switch components 912d).

In FIG. 10, a page buffer comprising one first bit line connection point 912a and two second bit line connection points 912b is taken as an example. In an example, there can also be three or more second bit line connection points 912 in the above page buffer.

In a possible example, based on the circuit architecture shown in FIG. 9 or FIG. 10, the control logic circuit 914 can ensure accurate execution of program operations and read operations by controlling ON/OFF states of the first switching component 912c and the second switching component 912d during the program operations and the read operations.

In some examples, the control logic circuit 914 is configured to turn off the first switching component 912c and turn on the second switching component 912d when a program operation is performed through the page buffer 912.

The control logic circuit 914 is configured to turn on the first switching component 912c and turn off the second switching component 912d when a read operation is performed through the page buffer 912.

For example, in the circuit structure shown in FIG. 9, when the first switching component 912c is turned off and the second switching component 912d is turned on, the respective independent precharging circuits of the first bit line connection point 912a and the second bit line connection point 912b may be in a turn-on state. Meanwhile, the respective independent precharge circuits of the first bit line connection point 912a and the second bit line connection point 912b are capable of not interfering with each other. At this time, the program operation can be performed through the page buffer 912. The bit lines in the memory cell array 920 may be precharged simultaneously via two bit line connection points, thereby enabling concurrent program operations on memory cells coupled to different bit lines in the memory cell array 920.

For another example, in the circuit structure shown in FIG. 9, when the first switching component 912c is turned on and the second switching component 912d is turned off, the precharge circuit of the second bit line connection point 912b is turned off, and the precharge circuit of the first bit line connection point 912a may be in a turn-on state. At the same time, since the first switching component 912c between the first bit line connection point 912a and the second bit line connection point 912b is turned on, the above two bit line connection points can share a precharge circuit (that is, the precharge circuit of the first bit line connection point 912a). At this time, if the circuits between the two bit line connection points and the bit lines in the memory cell array 920 are turned on in sequence, different bit lines in the memory cell array 920 can be precharged through the precharge circuit of the first bit line connection point 912a in sequence, and the memory cells coupled to the bit lines of the memory cell array 920 may be sensed or read through the two bit line connection points in sequence.

The above-mentioned different bit lines in the memory cell array 920 can be precharged through the precharge circuit of the first bit line connection point 912a, and the memory cells coupled to the bit lines of the memory cell array 920 may be sensed or read through the two bit line connection points in sequence can be implemented by turning on the connection between the two bit line connection points and the bit lines in sequence.

Figure 11:
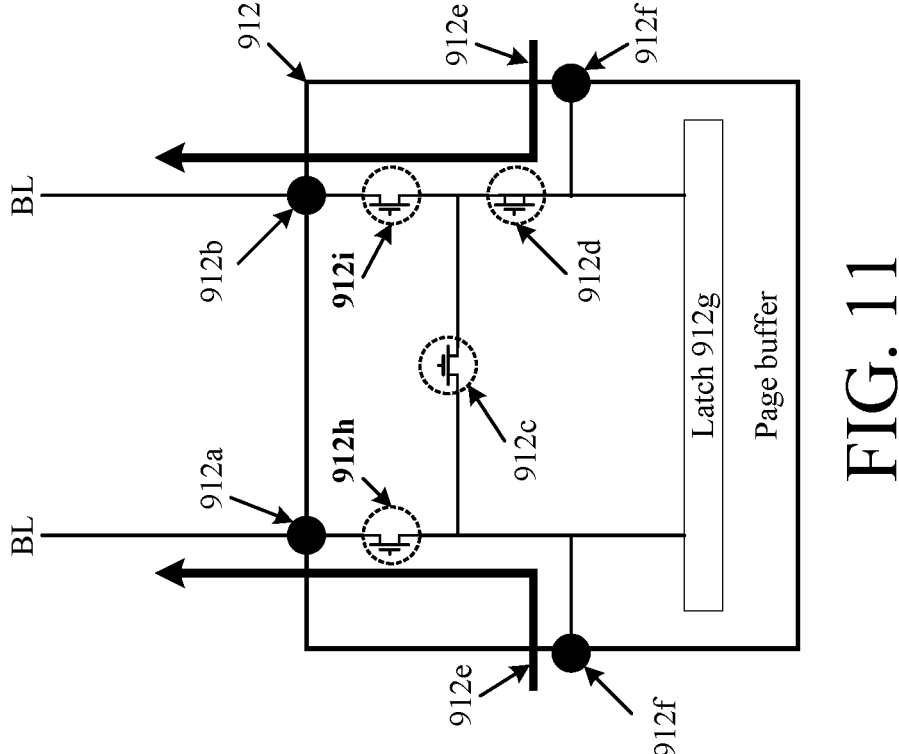
FIG. 11 is a schematic structural diagram of another page buffer involved in an example of the present application.

For example, based on the solution shown in FIG. 9, and with reference to FIG. 11, a schematic structural diagram of another page buffer involved in an example of the present application is shown. As shown in FIG. 11, the page buffer also includes a fourth switching component 912h and a fifth switching component 912i, wherein the fourth switching component 912h is located on the circuit between the first line connection point 912a and the first switching component 912c, on the circuit between the first bit line connection point 912a and the power terminal 912f, and outside the circuit between the first switching component 912c and the power terminal 912f. Correspondingly, the fifth switching component 912i is located on the circuit between the second bit line connection point 912b and the first switching component 912c, on the circuit between the second bit line connection point 912b and the power terminal 912f, and outside the circuit between the first switching component 912c and the power terminal 912f. During the read operation, the control logic circuit 914 first turns on the first switching component 912c and turns off the second switching component 912d. When the read operation is performed through the first line connection point 912a, the fourth switching component 912h is turned on, and the fifth switching component 912*i* is turned off. At this time, the bit line connected to the first line connection point 912*a* can be precharged through the precharge circuit corresponding to the first line connection point 912*a*. After the precharging is completed, the memory cells coupled to the bit line connected to the first line connection point 912*a* can be sensed/read through a sense amplifier circuit in the page buffer and a sensing latch in the latch 912*g*. Accordingly, when the read operation is performed through the second bit line connection point 912*b*, the fourth switching component 912*h* is turned off and the fifth switching component 912*i* is turned on. At this time, the bit line connected to the second bit line connection point 912*b* may be precharged by the precharge circuit corresponding to the first bit line connection point 912*a* through the first switching component 912*c* and the second bit line connection point 912*b*. After the precharging is completed, the memory cells coupled to the bit line connected to the second line connection point 912*b* can be sensed/read through the sense amplifier circuit in the page buffer and the sensing latch in the latch 912*g*. That is, in the read operation, the first bit line connection point and the second bit line connection point can share a precharge circuit, and accordingly, also share the sense amplifier circuit and the circuit corresponding to the sensing latch, so that the two bit line connection points can share a circuit for sensing/reading in a page buffer.

The structure of the page buffer shown in FIG. 11 is only explained by taking a page buffer including one first bit line connection point 912*a* and one second bit line connection point 912*b* as an example. In an example, the above-mentioned page buffer may also include two or more second bit line connection points 912*b*.

Figure 12:
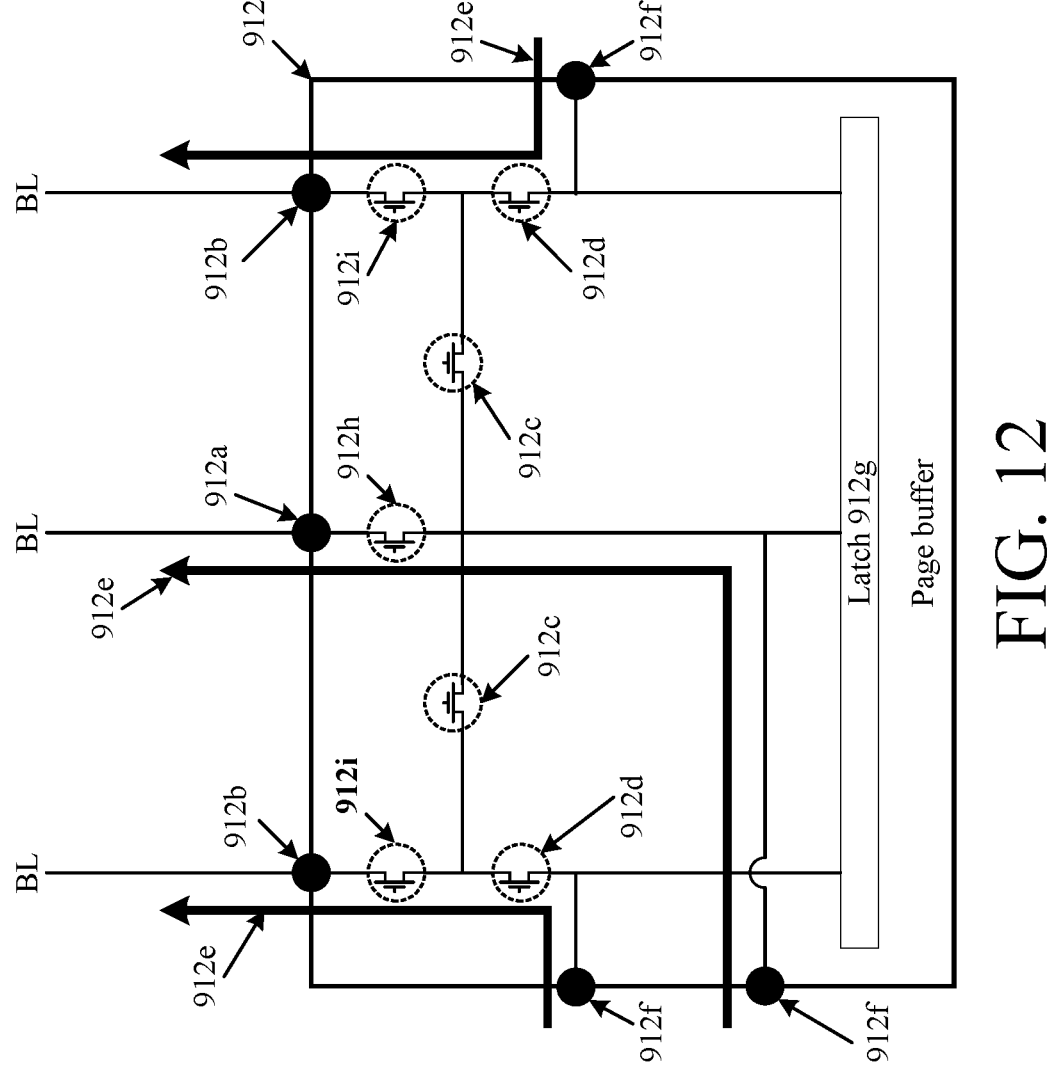
FIG. 12 is a schematic structural diagram of another page buffer involved in an example of the present application.

For example, a page buffer comprising one first bit line connection point 912*a* and two second bit line connection points 912*b* is taken as an example. Referring to FIG. 12, schematic structural diagram of another page buffer involved in an example of the present application is shown. As shown in FIG. 12, for the two second bit line connection points 912*b* in the page buffer, each of them corresponds to a fifth switching component 912*i*, and each fifth switching component 912*i* is located on the circuit between the corresponding second bit line connection point 912*b* and the first switching component 912*c*, on the circuit between the corresponding second bit line connection point 912*b* and the power terminal 912*f*, and outside the circuit between the first switching component 912*c* and the power terminal 912*f*. During the read operation, the control logic circuit 914 first turns on all the first switching components 912*c*, and turns off all the second switching components 912*d*. When the read operation is performed through the first line connection point 912*a*, the fourth switching component 912*h* is turned on and all fifth switching components 912*i* are turned off. When the read operation is performed through a certain second bit line connection point 912*b*, the fourth switching component 912*h* is turned off, the fifth switching component 912*i* corresponding to the current second bit line connection point 912*b* is turned on, and the fifth switching component 912*i* corresponding to the other second bit line connection point 912*b* is turned off. At this point, the bit line connected to the current second bit line connection point 912*b* may be precharged by the precharge circuit corresponding to the first bit line connection point 912*a*. After the precharging is completed, the memory cells coupled to the bit line connected to the current second bit line connection point 912*b* may be sensed/read by the sense amplifier circuit in the page buffer and the sensing latch in the latch 912*g*.

Similarly, based on the circuit structure shown in FIG. 12, if the above page buffer includes three or more second bit line connection points 912*b*, when the read operation is performed through one of the second bit line connection points 912*b*, the fifth switching component 912*i* corresponding to the current second bit line connection point 912*b* is turned on, and the fourth switching component 912*h* and the fifth switching component 912*i* corresponding to the other second bit line connection point 912*b* are turned off.

In a possible example of the present application, a third switching component 912*j* is disposed between the first bit line connection point and a sensing latch in the page buffer, and the third switching component is located outside the precharge circuit corresponding to the first line connection point.

In the example of the present application, since two or more bit line connection points share the precharge circuit corresponding to the first bit line connection point for precharging during the read operation, that is, a circuit between the first bit line connection point and the sensing latch needs to be present in the page buffer, and during the program operation, the circuit between the first bit line connection point and the sensing latch needs to be turned off. In this regard, in the example of the present application, a third switching component 912*j* may be disposed between the first bit line connection point and the sensing latch in the page buffer.

It should be noted that the above-mentioned third switching component 912*j* is also located on the circuit including the sensing latch, first switching component 912*c* and second bit line connection point 912*b* in sequence.

At the same time, the above-mentioned third switching component 912*j* is also located between the first line connection point and other circuit elements used for sensing/reading in the page buffer.

In a possible example of the present application, the control logic circuit 914 is configured to turn off the third switching component 912*j* when a program operation is performed through the page buffer 912. The control logic circuit 914 is configured to turn on the third switching component 912*j* when a read operation is performed through the page buffer 912.

In the example of the present application, during the program operation, the control logic circuit 914 can control the third switching component 912*j* to be turned off, thereby avoiding the program operation affecting the sensing latch and other circuit elements used for sensing/reading. Correspondingly, during the read operation, the control logic circuit 914 can control the third switching component 912*j* to be turned on, so that the sensing latch and other circuit elements used for sensing/reading can enables read operations to be properly performed on the memory cells coupled to the currently connected bit lines.

Figure 13:
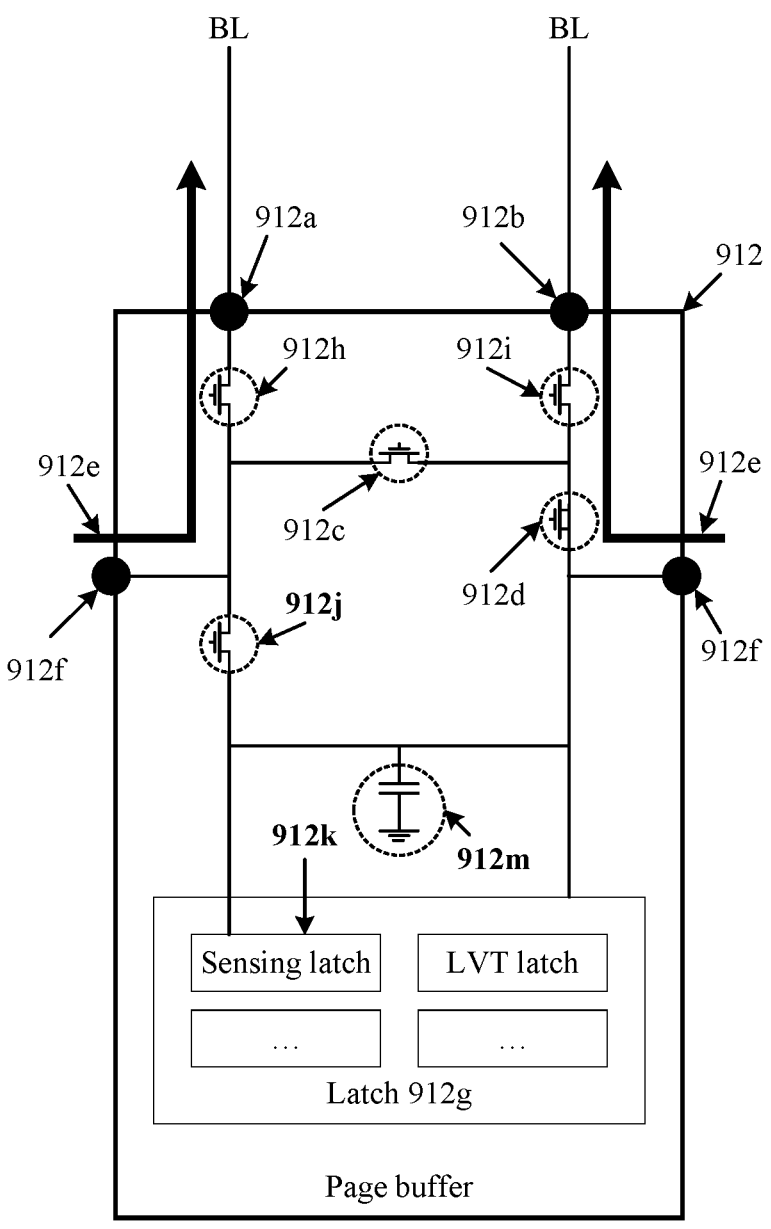
FIG. 13 is a schematic structural diagram of yet another page buffer involved in an example of the present application.

For example, based on FIG. 11 and referring to FIG. 13, a schematic structural diagram of another page buffer involved in an example of the present application is shown. As shown in FIG. 13, the latch 912*g* of the page buffer 912 includes a sensing latch 912*k* and other latches (such as an LVT latch). A grounded capacitive element 912*m* is included corresponding to the sensing latch. When the fourth switching component 912*h* is turned on, both the sensing latch 912*k* and the capacitive element 912*m* may be connected to the first line connection point 912*a*. When the first switching component 912*c* is turned on, the sensing latch 912*k* and the capacitive element 912*m* can also be connected to the corresponding second bit line connection point 912*b*. A third switching component 912*j* is disposed between the sensing latch 912k/capacitive element 912m and the two bit line connection points to avoid the impact of the read operation on the sensing latch 912k and the capacitive element 912m, as illustrated in FIG. 13. During the program operation, the third switching component 912j is turned off to avoid the impact of the program operation on the sensing latch 912k and the capacitive element 912m. During the read operation, the third switching component 912j is turned on, and at this time, the read operation may be performed through the sensing latch 912k and the capacitive element 912m.

In the above-mentioned FIG. 13, the capacitive element 912m is a grounded capacitor. In an example, the above-mentioned capacitive element 912m does not need to be grounded. For example, the above-mentioned capacitive element 912m can be connected to any fixed potential. In addition, the above-mentioned capacitive element 912m may be a designed and prepared capacitive device. Alternatively, the above-mentioned capacitive element may be a parasitic capacitor.

Figure 14:
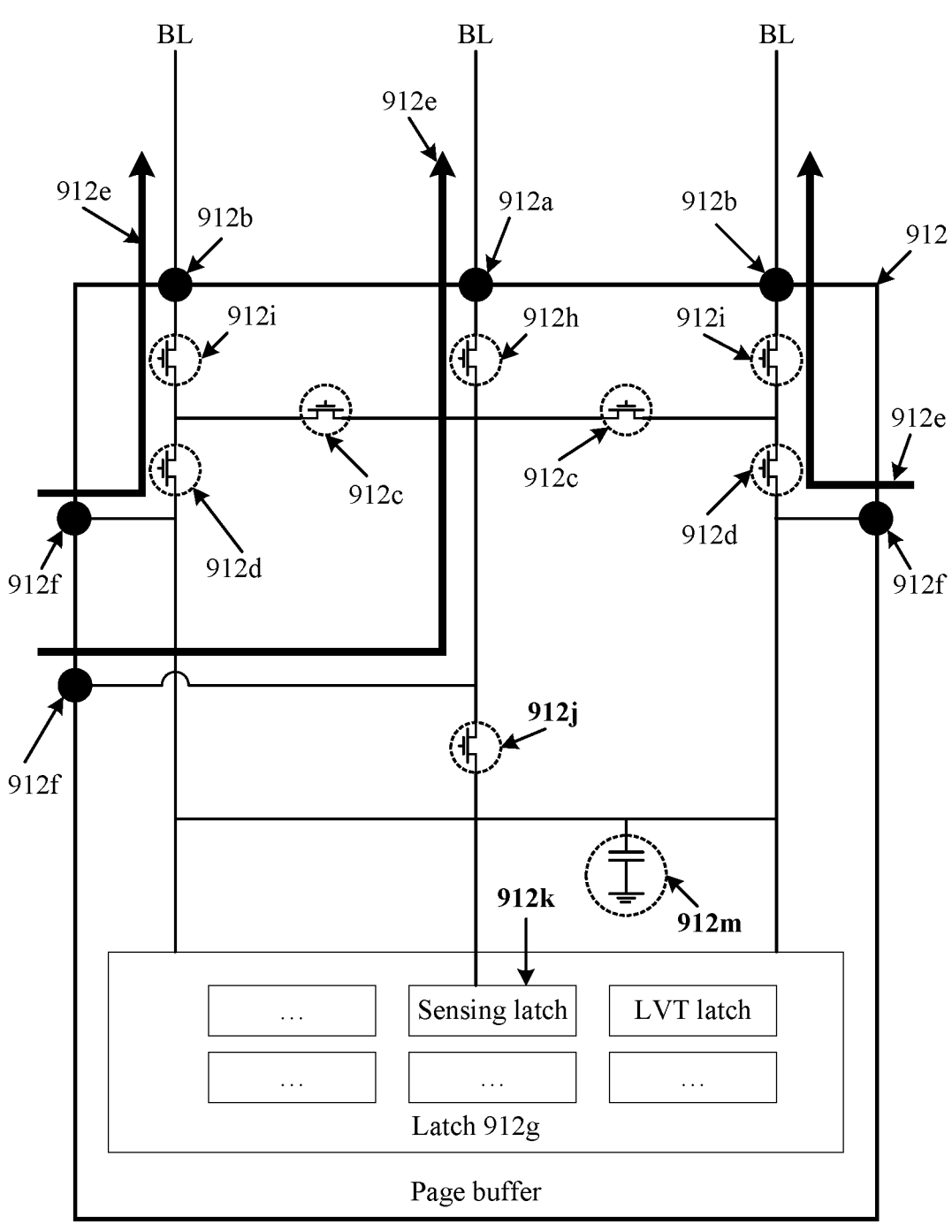
FIG. 14 is a schematic structural diagram of yet another page buffer involved in an example of the present application.

The above-mentioned page buffer structure shown in FIG. 13 is still applicable to the case where one page buffer comprises two or more second bit line connection points 912b. For example, referring to FIG. 14, a schematic structural diagram of yet another page buffer involved in an example of the present application is shown. As shown in FIG. 14, when the fourth switching component 912h is turned on, both the sensing latch 912k and the capacitive element 912m can be connected to the first line connection point 912a. When a certain first switching component 912c is turned on, the sensing latch 912k and the capacitive element 912m may be connected to the second bit line connection point 912b corresponding to that first switching component 912c. In FIG. 14, a third switching component 912j is disposed between the sensing latch 912k/capacitive element 912m and the three bit line connection points to avoid the read operation affecting the sensing latch 912k and capacitive element 912m.

In a possible example of the present application, a sixth switching component 912p and a seventh switch device 912q are also provided on the precharge circuit corresponding to the second bit line connection point 912b between the second switching component 912d and the power terminal 912f. The sixth switching component 912p is controlled to be turned on or off by the register 912g. For example, when the register 912g has sufficient voltage output, the sixth switching component 912p is turned on. In some examples, for example, at least during the program operation, the register 912g will control the sixth switching component 912p to be turned on. The seventh switch device 912q can be controlled to be turned on or off by the control logic circuit 914. For example, outside the programming process, when the register 912g has sufficient voltage output, the seventh switch device 912q will be turned on. If the control logic circuit 914 is controlling the page buffer to perform a read operation at this time, the power terminal 912f will affect the capacitive element 912m. In this regard, the control logic circuit 914 can control the seventh switch device 912q to be turned off to ensure the correct performance of the read operation. During the program operation, when it is needed to precharge the bit line connected to the second bit line connection point 912b, the control logic circuit 914 can control the seventh switch device 912q to be turned on, to ensure successful precharging.

Figure 15:
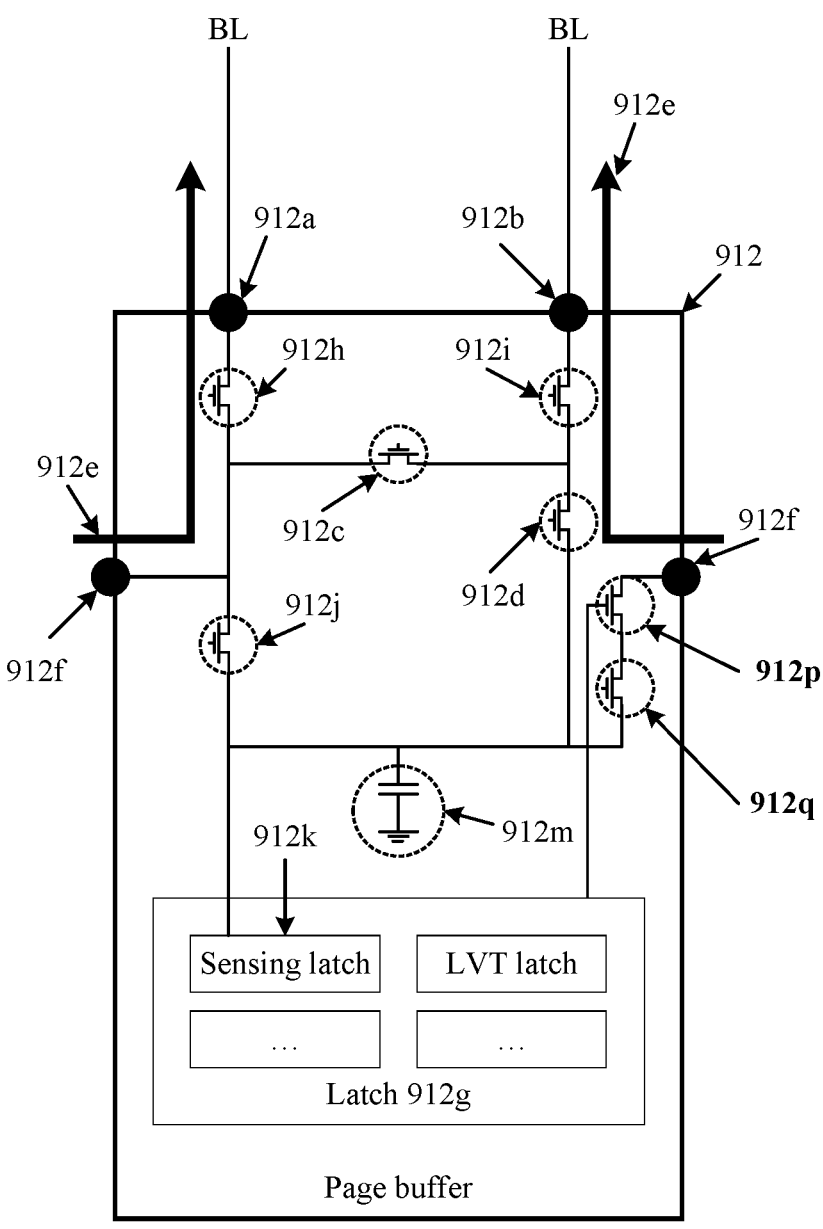
FIG. 15 is a schematic structural diagram of yet another page buffer involved in an example of the present application.

For example, referring to FIG. 15, a schematic structural diagram of yet another page buffer involved in an example of the present application is shown. As shown in FIG. 15, a sixth switching component 912p and a seventh switch device 912q are provided in sequence near the power terminal 912f on the precharge circuit corresponding to the second bit line connection point 912b, and ON/OFF state of the sixth switching component 912p is controlled by the register 912g. In addition, the seventh switch device 912q is controlled by the control logic circuit 914. During the program operation, in the stage of precharging the bit line through the second bit line connection point 912b, the register 912g has a voltage output to control the sixth switching component 912p to be turned on. Meanwhile, the control logic circuit 914 controls the seventh switch device 912q, the second switching component 912d and the fifth switching component 912i corresponding to that second bit line connection point 912b to be turned on. At this time, the precharge circuit between the power terminal 912f to the second bit line connection point 912b is turned on to enable precharging. During the read operation, the register 912g may have a voltage output, that is, the sixth switching component 912p may be in the turn-on state. At this time, the control logic circuit 914 needs to control the seventh switch device 912q to be turned off to prevent the voltage output by the power terminal 912f being applied to the capacitive element 912m.

The precharge circuit corresponding to the above-mentioned first line connection point 912a also has two switching components with the same functions and connection as the sixth switching component 912p and the seventh switch device 912q, which will not be described again herein.

In addition, the above-mentioned sixth switching component 912p and seventh switch device 912q are also applicable to the circuit structure having multiple second bit line connection points 912b. That is, when the page buffer 912 includes two or more second bit line connection points, the precharge circuit corresponding to each second bit line connection point 912b includes the above-mentioned sixth switching component 912p and seventh switch device 912q respectively.

Figure 16:
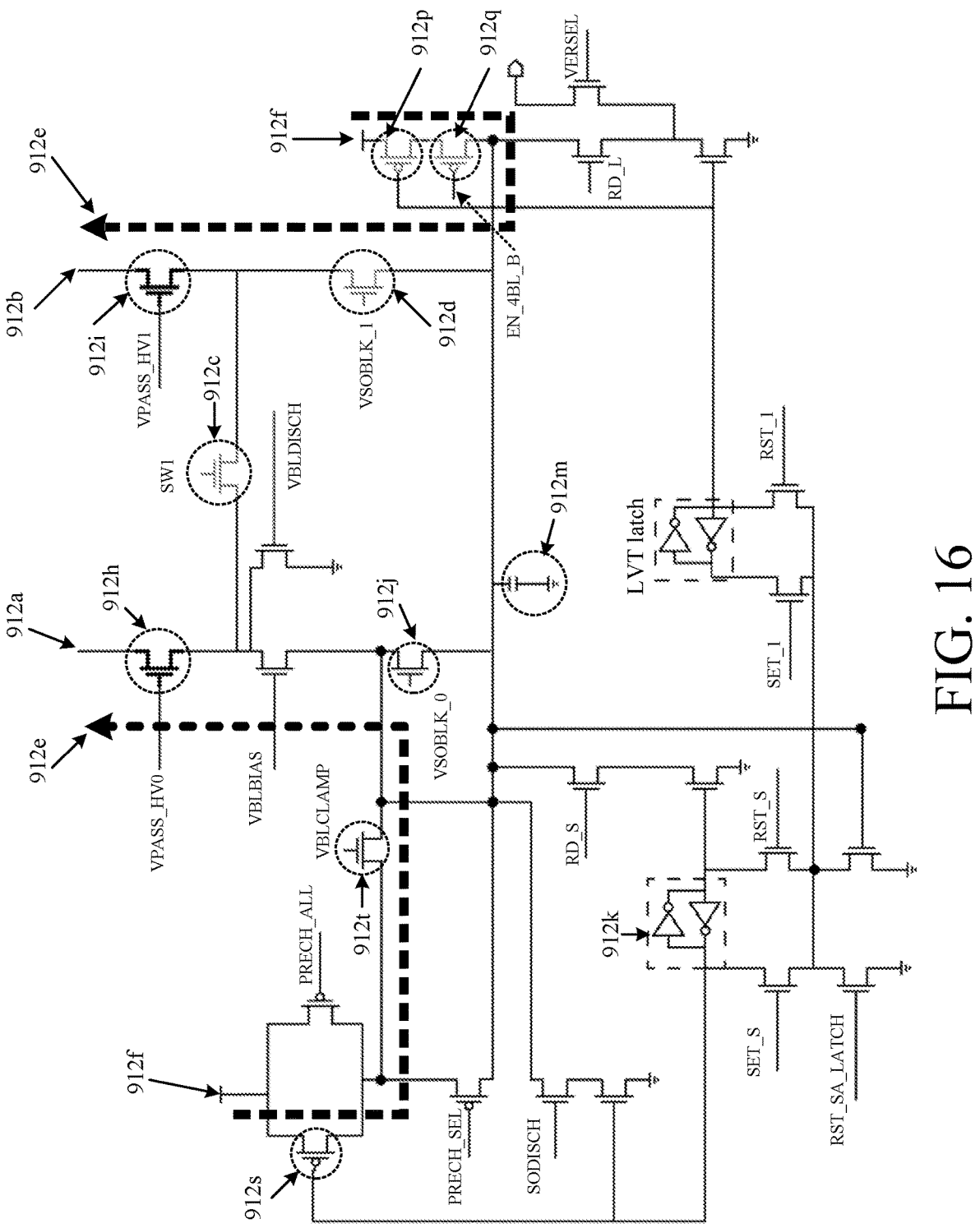
FIG. 16 is a circuit structure diagram of a page buffer involved in an example of the present application.

Based on the solutions shown in FIGS. 9 to 15 above, and referring to FIG. 16, a circuit structure diagram of a page buffer involved in an example of the present application is shown. Taking a page buffer comprising two bit line connection points as an example, the positions of the first line connection point 912a, the second bit line connection point 912b, the first switching component 912c, the second switching component 912d, the precharge circuit 912e, the power terminal 912f, the fourth switching component 912h, the fifth switching component 912i, the third switching component 912j, the sensing latch 912k, the capacitive element 912m, the sixth switching component 912p, and the seventh switch device 912q are shown in FIG. 16.

In FIG. 16, the first switching component 912c can be controlled to be turned on via a SW1 signal, the second switching component 912d can be controlled to be turned on via a VSOBLK_1 signal, the third switching component 912j can be controlled to be turned on via a VSOBLK_0 signal, the fourth switching component 912h can be controlled to be turned on via a VPASS_HV0 signal, the fifth switching component 912i can be controlled to be turned on via a VPASS_HV1 signal, and the seventh switch device 912q can be controlled to be turned on via an EN_4BL_B signal.

For the first line connection point 912a, the switching component corresponding to the sixth switching component 912p thereof is an eighth switching component 912s, and the switching component corresponding to the seventh switch device 912q thereof is a ninth switching component 912t.

The ninth switching component 912*t* can be controlled to be turned on via a VBLCLAMP signal.

In the memory involved in the solutions shown in any of the above-mentioned FIGS. 5 to 16, two bit line connection points can be connected to multiple bit lines respectively.

In a possible example of the present application, the first bit line connection point is connected to N bit lines of 2×N bit lines comprised in the memory cell array, and the second bit line connection point is connected to other N bit lines of the 2×N bit lines, N being an integer greater than or equal to 2; and the 2×N bit lines are adjacent in sequence, and the bit lines connected to the first bit line connection point and the second bit line connection point respectively are interleaved in sequence.

Figure 17:
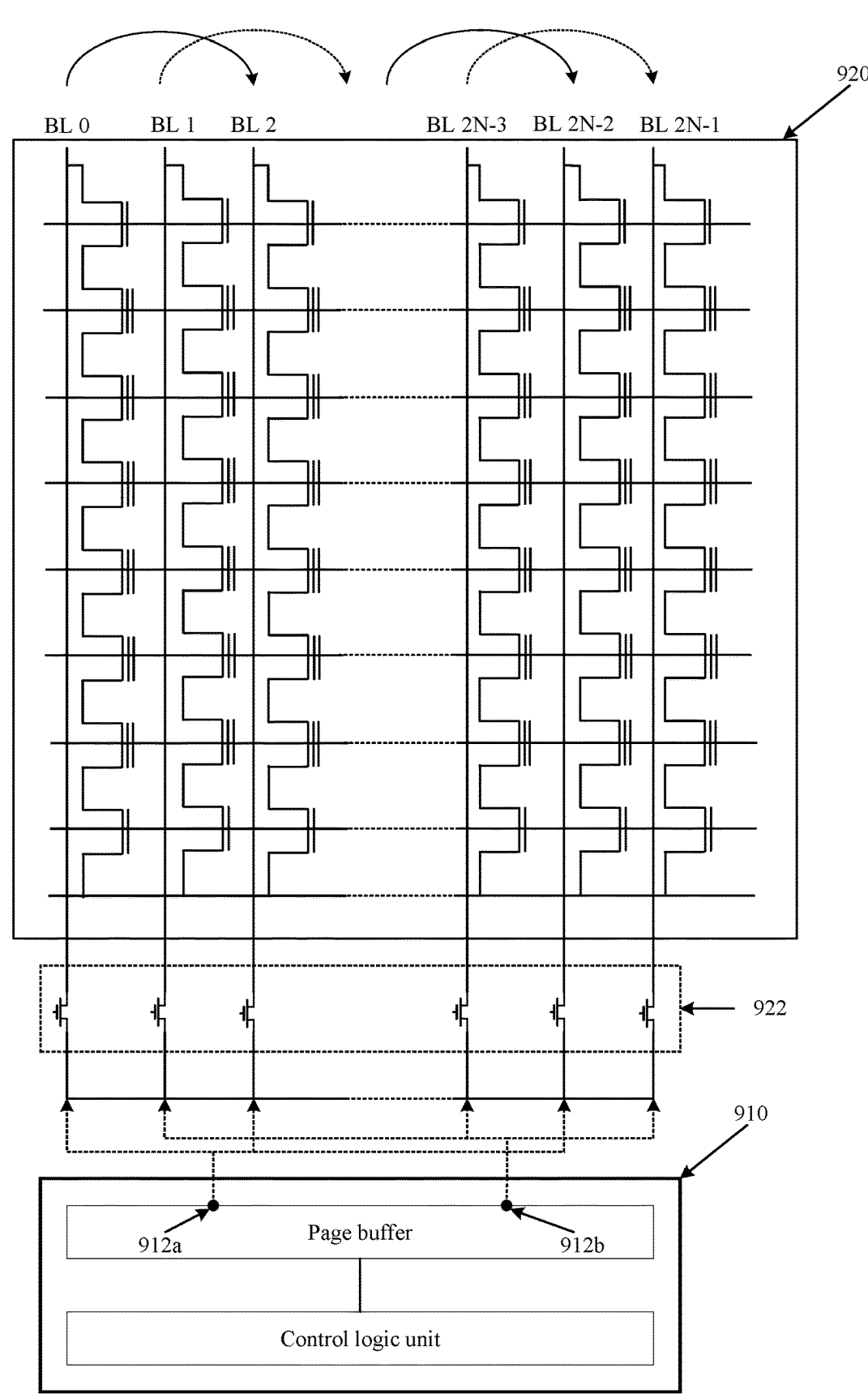
FIG. 17 is a schematic diagram of a connection between a page buffer and bit lines involved in an example of the present application.

Referring to FIG. 17, a schematic diagram of the connection between a page buffer and a bit line involved in an example of the present application is shown. As shown in FIG. 17, the memory cell array comprises at least 2×N bit lines that are adjacent in sequence, numbered BL 0 to BL 2N–1 respectively. The first bit line connection point 912*a* and the second bit line connection point 912*b* are connected to the N bit lines thereof respectively through the switching component 922, and the bit lines connected to the first bit line connection point and the second bit line connection point are interleaved in sequence. That is, among the above 2×N bit lines, one bit line of every two adjacent bit lines is connected to the first bit line connection point 912*a* through the switching component 922, and the other bit line is connected to the second bit line connection point 912*b* through the switching component 922. In some examples, in FIG. 17, for example, the first bit line connection point 912*a* is connected to BL 0, BL 2, . . . , BL 2N–2 through the switching component 922, and the second bit line connection point 912*b* is connected to BL 1, . . . , BL 2N–3 and BL 2N–1 through the switching component 922 respectively.

The above-mentioned switching component 922 can connect a bit line connection point with one of the corresponding N bit lines at the same point in time, and disconnect that bit line connection point from the other N–1 bit lines of the corresponding N bit lines. Different bit line connection points can be connected to respective corresponding bit lines at the same time.

In a possible example of the present application, the control logic circuit 914 is configured to apply a bias voltage to a second bit line during the program operation performed through the page buffer 912 on memory cells coupled to a first bit line, and wherein the first bit line and the second bit line are two adjacent bit lines of the 2×N bit lines.

The page buffer involved in the solutions shown in the above examples of the present application, and the connection relationship between the two bit line connection points in the page buffer and the bit lines in the memory cell array enable the removal of BL to BL coupling during the program operation.

In some examples, parasitic capacitance is an unavoidable and often unwanted capacitance that exists between parts of electronic elements or circuit simply because they are in close proximity to each other. When two electrical conductors with different voltages are placed against each other, the electric field therebetween causes charges to be stored on the two electrical conductors, and this effect is called capacitance. For high-density memory cell arrays, the bit lines thereof may will be very long, and the spacing between the bit lines may be very close. When the distance between the bit lines is close, mutual capacitance will occur between the two bit lines. This mutual capacitance appears to parasitize between the wirings. For this reason, it can be called parasitic capacitance, also called stray capacitance. Due to the existence of parasitic capacitance between bit lines, when the program operations is performed on multiple bit lines successively through the page buffer, it may cause problems of coupling from bit lines to bit lines. For example, taking the FIG. 17 above as an example, the page buffer performs a program operation on BL 0 at time 1. At the time 2 after the program operation on BL 0 is completed, the page buffer performs a program operation on BL 1. Since BL 0 and BL 1 are two adjacent bit lines, the distance between the two is close, and thus there will be a parasitic capacitance between the two bit lines. When the page buffer performs a program operation on BL 1, coupling will occur between BL 1 and BL 0, causing the data already stored in the memory cell in BL 0 to change, resulting in data errors. Similarly, at time 3 after the program operation on BL 1 is completed, the page buffer performs a program operation on BL 2. Since BL 1 and BL 2 are two adjacent bits lines, and the distance between them is close, there will be a parasitic capacitance. When the page buffer performs a program operation on BL 2, coupling will occur between BL 1 and BL 2, causing the data already stored in the memory cell in BL 1 to change, resulting in data errors.

Regarding the above problem, based on the connection between the bit line connection point and the bit line shown in FIG. 17 of the present application, two adjacent bit lines are connected to different bit line connection points in a page buffer, and different bit line connection points have independent precharge circuits. Therefore, for two adjacent bit lines, when the page buffer performs a program operation on the memory cells coupled to the first bit line through a bit line connection point, the adjacent second bit line is connected to another bit line connection point, and therefore, the page buffer can apply a bias voltage to the second bit line through the precharge circuit corresponding to the other bit line connection point at this time, thus suppressing the coupling between the first bit line and the second bit line.

For example, in FIG. 17, the page buffer begins to perform the program operation on BL 0 through the first bit line connection point at time 1. During this program operation, the page buffer can apply a bias voltage to BL 1 through the second bit line connection point to suppress the coupling between BL 0 and BL 1. Similarly, at time 2, the page buffer begins to perform the program operation on BL 1 through the second bit line connection point. During the program operation, the page buffer can apply a bias voltage to BL 0 through the first bit line connection point to suppress the coupling between BL 0 and BL 1.

In a possible example of the present application, the control logic circuit is configured to, when the program operation is performed on memory cells coupled to the 2×N bit lines through the page buffer: apply program pulse voltages to the 2×N bit lines in sequence according to an arrangement order of the 2×N bit lines through the first bit line connection point and the second bit line connection point, and wherein there is an overlap in time intervals of applying the program pulse voltages to two adjacent bit lines of the 2×N bit lines, such that during the program operation performed on memory cells coupled to a bit line, a bias voltage is applied to adjacent bit lines of the bit line.

In the above example, the page buffer begins to perform the program operation on BL 0 through the first bit line connection point. During the program operation, the page buffer applies a bias voltage to BL 1 through the second bit line connection point. If the bias voltage applied by the page buffer to BL 1 through the second bit line connection point at this time is only used to eliminate the coupling between BL 0 and BL 1, it will cause the page buffer to be unable to perform the program operation through the second bit line at this time at this point, which will affect the concurrency performance of program operations, lead to too long programming time, and thus affect the rate of data writing.

In this regard, the solution shown in the example of the present application provides a timing design for programming memory cells coupled to adjacent bit lines through two bit line connection points respectively. In some examples, for example, when a program operation is performed on the memory cells coupled to the first bit line by the page buffer through a first bit line connection point, after the program operation starts and before the program operation ends, the page buffer starts to perform the program operation on the memory cells coupled to the second bit line adjacent to the first bit line through the second bit line connection point. Since the program operation on the memory cells coupled to the first bit line has not yet ended, the program pulse voltage is still being applied to the first bit line through the first bit line connection point. Therefore, the program pulse voltage (i.e., the above-mentioned bias voltage) applied by the page buffer to the second bit line through the second bit line connection point will not cause coupling between the first bit line and the second bit line. Correspondingly, when the page buffer finishes programming the memory cells coupled to the first bit line through the first bit line connection point, the program operation performed on memory cells coupled to the next third bit line adjacent to the second bit line through the first bit line connection point may start. At this time, the program operation on the memory cells coupled to the second bit line has not yet ended, and the program pulse voltage is still being applied to the second bit line through the second bit line connection point. Therefore, the program pulse voltage (i.e., the above-mentioned bias voltage) applied to the third bit line by the page buffer through the first bit line connection point will not cause coupling between the second bit line and the third bit line, and so on. With the execution timing of the above program operation, the scheme shown in this application can suppress the coupling between adjacent bit lines without affecting the concurrent performance of program operations through two bit line access points respectively.

Figure 18:
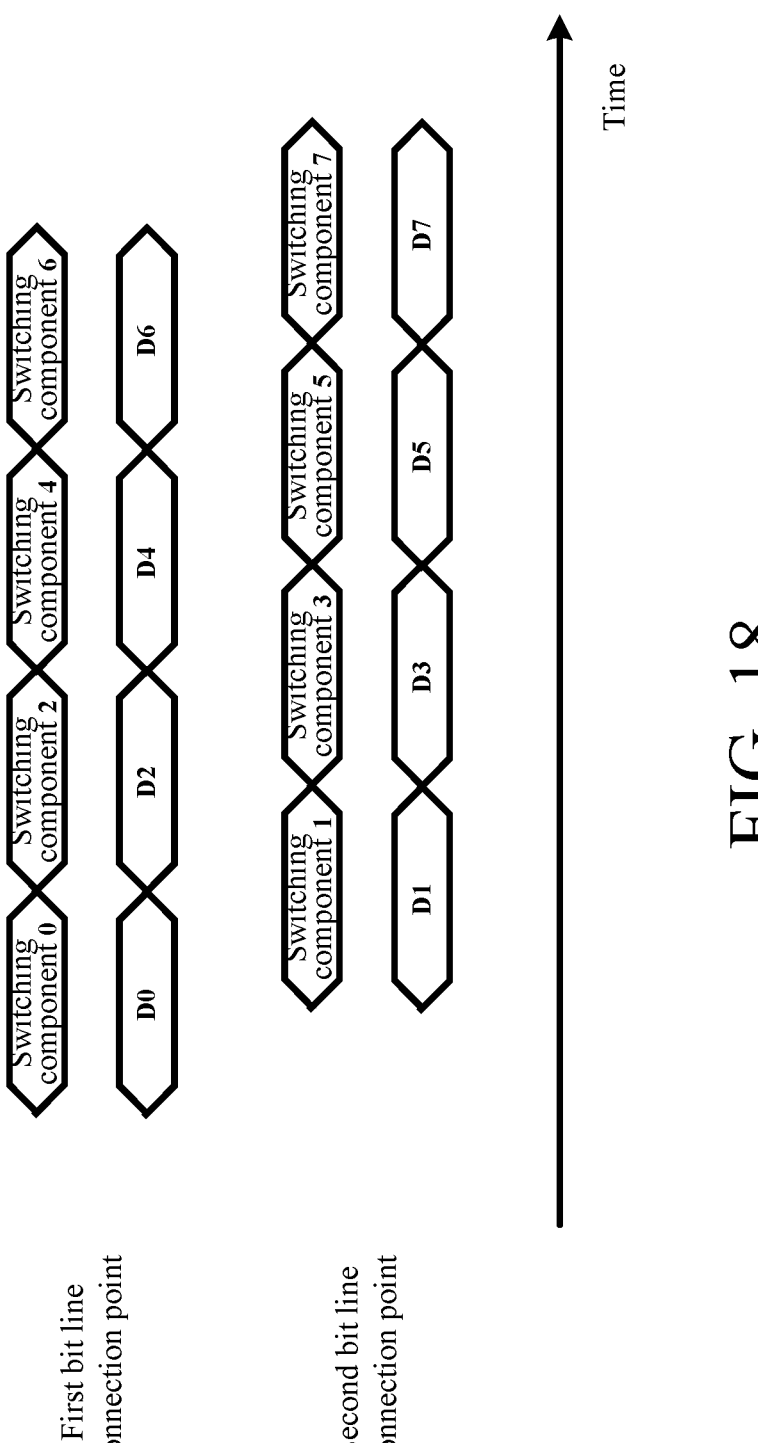
FIG. 18 is an execution timing diagram of a program operation involved in an example of the present application.

Referring to FIG. 18, an execution timing diagram of a program operation involved in an example of the present application is shown. As shown in FIG. 18, the first bit line connection point and the second bit line connection point in the page buffer are each connected to 4 bit lines according to the connection shown in FIG. 17. Assuming that the first bit line connection point is connected to the BL 0, BL 2, BL 4 and BL 6 respectively through the switching component 0, switching component 2, switching component 4 and switching component 6, and the second bit line connection point is connected to BL 1, BL 3, BL 5 and BL 7 respectively through the switching component 1, switching component 3 and switching component 5 and switching component 6. The data to be programmed corresponding to BL 0~BL 7 are D 0~D 7 respectively. As shown in FIG. 18, the time interval corresponding to the switching component 0 to switching component 7 is the time when switching component 0 to switching component 7 is turned on respectively. The time interval corresponding to D 0 to D 7 is the loading time of D 0 to D 7 respectively. It can be seen from FIG. 18 that in the order from BL 0 to BL 7, the turn-on times of the switching components corresponding to two adjacent bit lines interleave with each other, thereby ensuring that when one bit line starts to be programmed, the program operation on the adjacent previous bit line has not yet ended, inhibiting coupling between the two bit lines.

With the bit line connection shown in FIG. 17 and the program operation timing shown in FIG. 18, it is ensured that the couplings between the eight bit lines BL 0 to BL 7 are suppressed. Then, when there are adjacent bit lines after BL 7 (such as BL 8), since BL 8 is the bit line corresponding to other page buffers, the program operation on BL 8 will cause the coupling of BL 8 to BL 7 in the case where the program operation is not being performed on BL 7 at the time when other page buffers start to program the memory cells coupled to BL 8. If the program operation on BL 7 has been completed at this time, the data in BL 7 will be changed, resulting in data errors. In this regard, the solution shown in the example of the present application can coordinately control the program operations of the two page buffers by the control logic circuit, such that the time at which different page buffers perform program operations on the memory cells coupled to BL 7 and BL 8 respectively is the same or overlaps.

In a possible example of the present application, for 4×N bit lines that are adjacent in sequence and connected to two page buffers in the memory cell array, an order in which the first 2×N bit lines of the 4×N bit lines are applied with the program pulse voltages in sequence is opposite to an order in which the latter 2×N bit lines of the 4×N bit lines are applied with the program pulse voltages in sequence.

Figure 19:
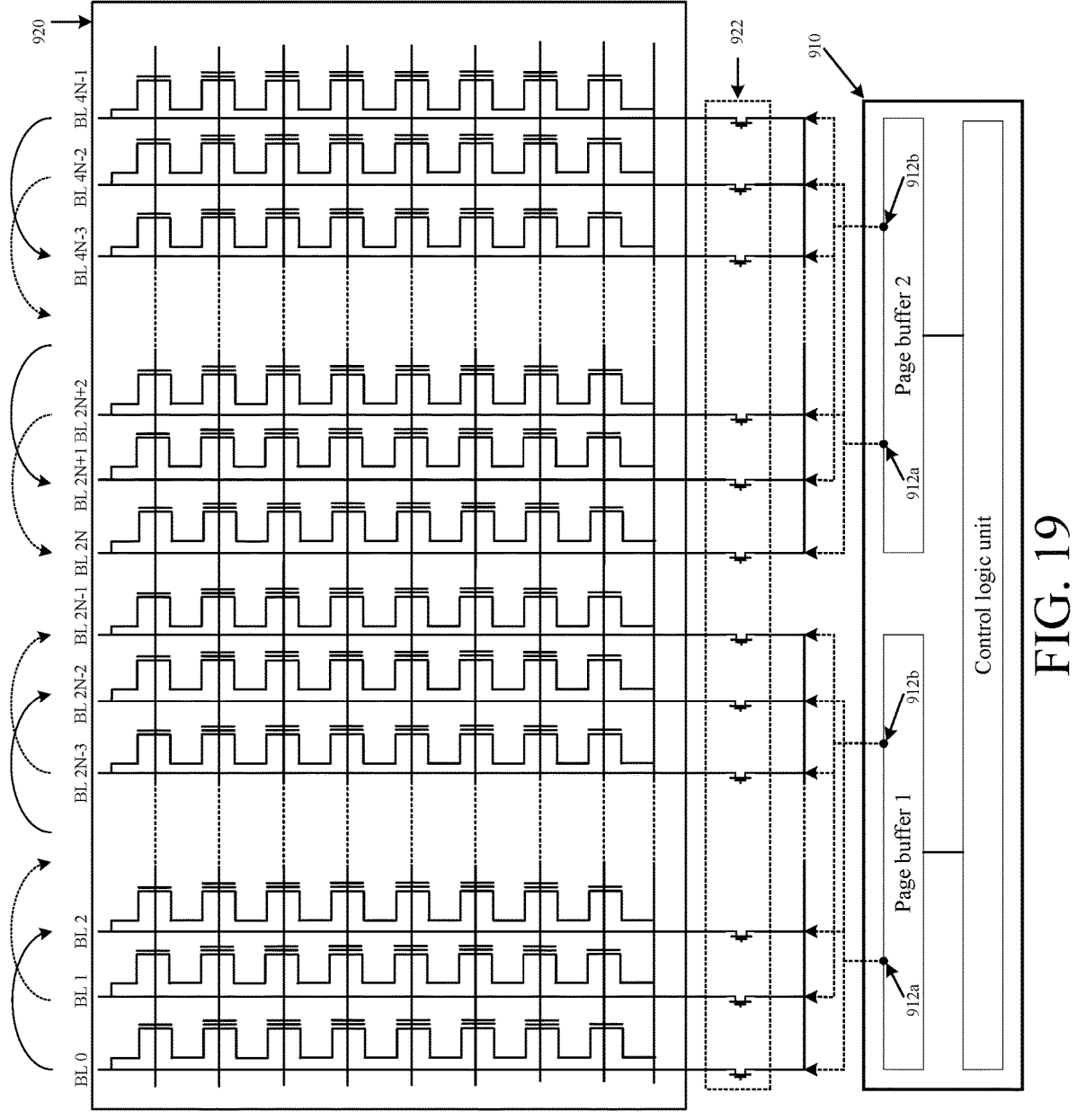
FIG. 19 is a schematic diagram of a connection between a page buffer and bit lines involved in an example of the present application.

To be more specific, for 4×N bit lines that are adjacent in sequence, the first and latter parts of the 4×N bit lines will be connected to different page buffers respectively. For example, referring to FIG. 19, a schematic diagram of a connection between a page buffer and a bit line involved in the examples of the application is shown. As shown in FIG. 19, the memory cell array comprises at least 4×N bit lines that are adjacent in sequence, numbered BL 0~BL 4N−1 respectively. The first bit line connection point 912*a* and the second bit line connection point 912*b* of the page buffer 1 are connected to the N bit lines of the first 2×N bit lines respectively through the switching component 922, and the bit lines connected to the first bit line connection point and the second bit line connection point are interleaved in sequence. For example, in FIG. 19, the first line connection point 912*a* of the page buffer 1 is connected to BL 0, BL 2, . . . BL 2N−2 through the switching component 922, and the second bit line connection point 912*b* of the page buffer 1 is connected to BL 1, . . . , BL 2N−3, and BL 2N−1 respectively through the switching component 922. Correspondingly, the first bit line connection point 912*a* and the second bit line connection point 912*b* of the page buffer 2 are connected to the N bit lines of the latter 2×N bit lines respectively through the switching component 922, and the bit lines connected to the first bit line connection point and the second bit line connection point are interleaved in sequence. For example, in FIG. 19, the first line connection point 912*a* of the page buffer 2 is connected to BL 2N, BL 2N+2, . . . , BL 4N−2 respectively through the switching component 922, and the second line connection point 912*b* of the page buffer 2 is connected to BL 2N+1, . . . , BL 4N−3, and BL 4N−1 respectively through the switching component 922.

Figure 20:
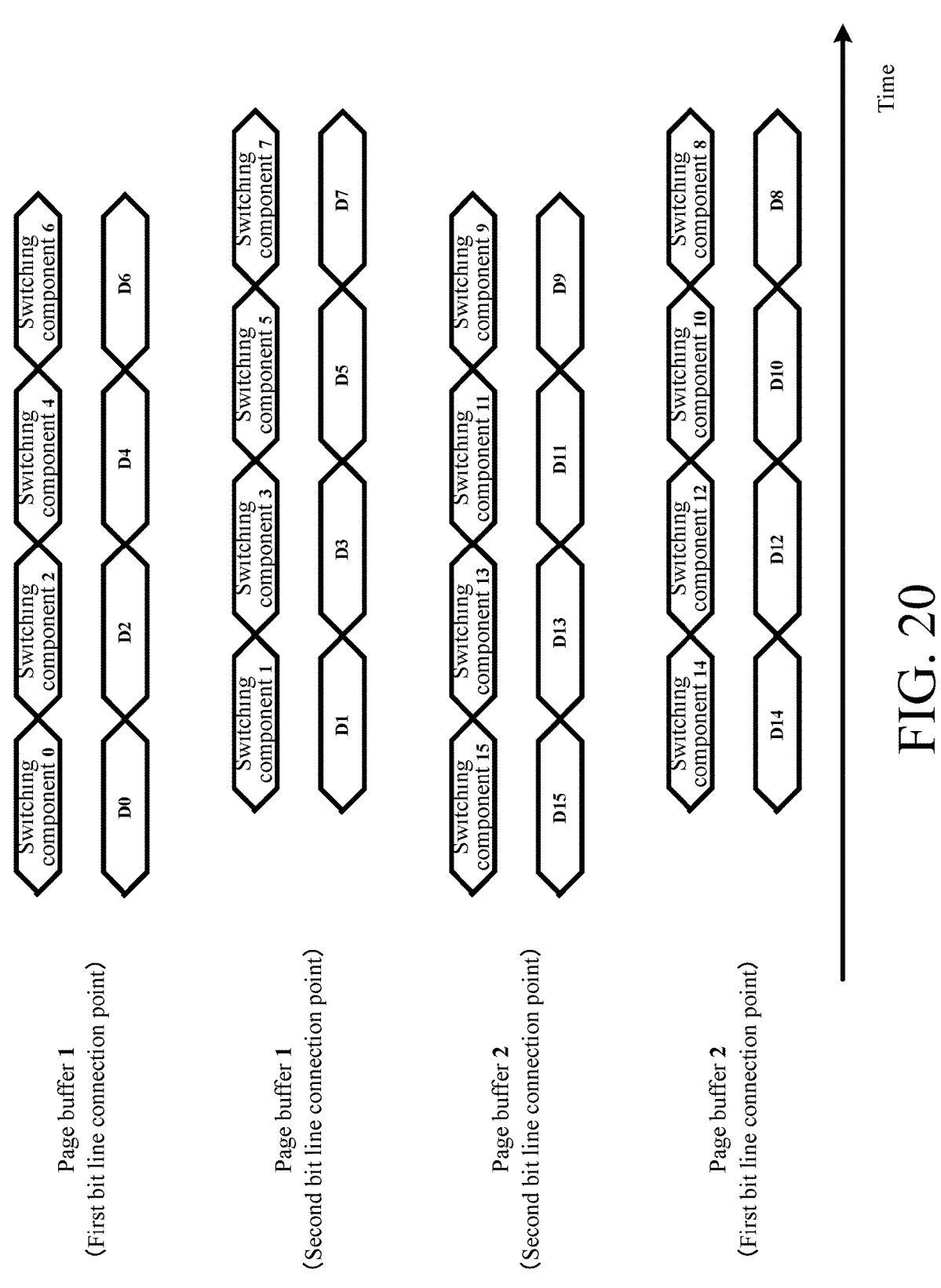
FIG. 20 is an execution timing diagram of another program operation involved in an example of the present application.

In connection with FIG. 19 and with reference to FIG. 20, an execution timing diagram of another program operation involved in an example of the present application is shown. For example, the first bit line connection point and the second bit line connection point in page buffer 1 and page buffer 2 are each connected to 4 bit lines according to the connection shown in FIG. 19, as shown in FIG. 20. It is assumed that the first bit line connection point in the page buffer 1 is connected to BL 0, BL 2, BL 4 and BL 6 respectively through switching component 0, switching component 2, switching component 4 and switching component 6, the second bit line connection point in the page buffer 1 is connected to BL 1, BL 3, BL 5 and BL 7 respectively through switching component 1, switching component 3, switching component 5 and switching component 6, the first bit line connection point in the page buffer 2 is connected to BL 8, BL 10, BL 12 and BL 14 respectively through the switching component 8, the switching component 10, the switching component 12 and the switching component 14, and the second bit line connection point in the page buffer 2 is connected to BL 9, BL 11, BL 13 and BL 15 respectively through the switching component 9, Switching component 11, switching component 13 and switching component 15. The data to be programmed corresponding to BL 0 to BL 15 are D 0 to D 15 respectively. As shown in FIG. 20, the corresponding time intervals of switching component 0 to switching component 15 are the time when switching component 0 to switching component 15 is turned on respectively. The corresponding time intervals of D 0 to D 15 are the loading time of D 0 to D 15 respectively. It can be seen from FIG. 20 that in the order from BL 0 to BL 7, the turn-on times of the switching components corresponding to two adjacent bit lines interleave with each other, and in the order from BL 15 to BL 8, the turn-on times of the switching components corresponding to two adjacent bit lines interleave with each other, thereby ensuring that when one bit line starts to be programmed, the program operation on the adjacent previous bit line has not yet ended, and at the same time, the program operation by the two page buffers can be synchronized. The time of the program operation on BL 7 and BL 8 is the same, such that the coupling between each two adjacent bit lines in respective bit lines corresponding to the two page buffers can be suppressed.

Figure 21:
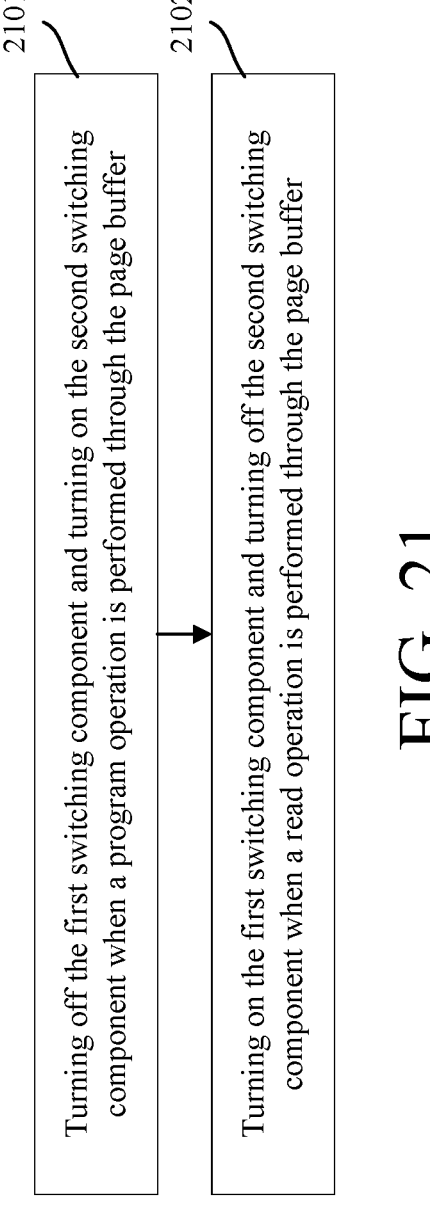
FIG. 21 is a flow chart of a method of operating a memory provided by an example of the present application.

FIG. 21 is a flow chart of a method of operating a memory provided by an example of the present application. The method is applied to the memory and performed by the control logic circuit in the peripheral logic circuit of the memory. The memory may be the memory as shown in FIG. 9, FIG. 17 or FIG. 19. As shown in FIG. 21, the method includes the followings.

Operation 2101: turning off the first switching component and turning on the second switching component when a program operation is performed through the page buffer.

Operation 2102: turning on the first switching component and turning off the second switching component when a read operation is performed through the page buffer.

In a possible example of the present application, a third switching component is disposed between the first bit line connection point and a sensing latch in the page buffer, and the third switching component is located outside the precharge circuit corresponding to the first line connection point.

In a possible example of the present application, the above method further comprises: turning off the third switching component when the program operation is performed through the page buffer; and turning on the third switching component when the read operation is performed through the page buffer.

In a possible example of the present application, the first bit line connection point is connected to N bit lines of 2×N bit lines comprised in the memory cell array, and the second bit line connection point is connected to other N bit lines of the 2×N bit lines, N being an integer greater than or equal to 2; and the 2×N bit lines are adjacent in sequence, and the bit lines connected to the first bit line connection point and the second bit line connection point respectively are interleaved in sequence.

In a possible example of the present application, the above method further comprises: applying a bias voltage to a second bit line during the program operation performed through the page buffer on memory cells coupled to a first bit line, and wherein the first bit line and the second bit line are two adjacent bit lines of the 2×N bit lines.

In a possible example of the present application, the applying a bias voltage to a second bit line during the program operation performed through the page buffer on memory cells coupled to a first bit line comprises: when the program operation is performed on memory cells coupled to the 2×N bit lines through the page buffer, applying program pulse voltages to the 2×N bit lines in sequence according to an arrangement order of the 2×N bit lines via the first bit line connection point and the second bit line connection point, and wherein there is an overlap in time intervals of applying the program pulse voltages to two adjacent bit lines of the 2×N bit lines, such that during the program operation performed on memory cells coupled to a bit line, a bias voltage is applied to adjacent bit lines of the bit line.

In a possible example of the present application, for 4×N bit lines that are adjacent in sequence and connected to two page buffers in the memory cell array, an order in which the first 2×N bit lines of the 4×N bit lines are applied with the program pulse voltages in sequence is opposite to an order in which the latter 2×N bit lines of the 4×N bit lines are applied with the program pulse voltages in sequence.

Figure 22:
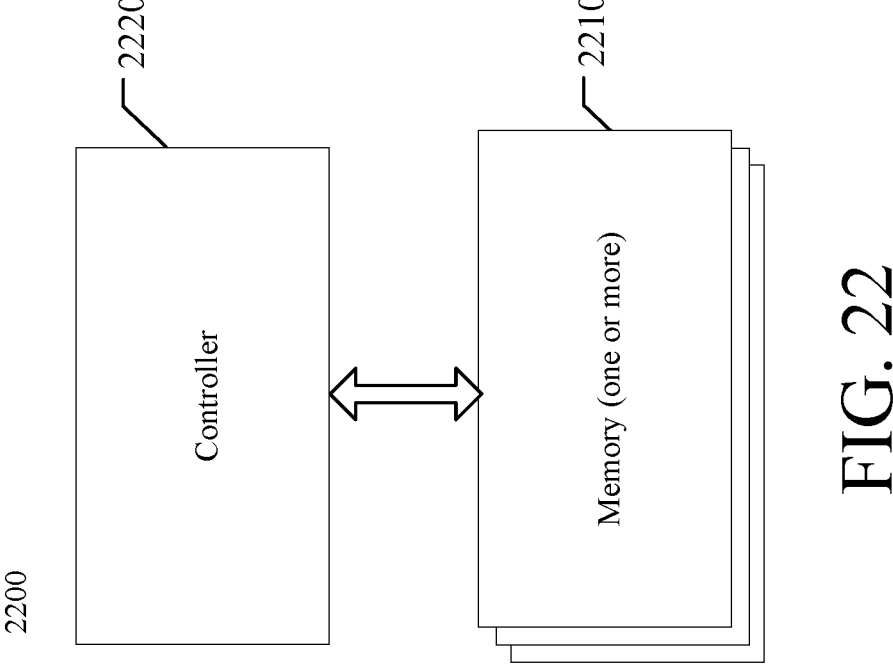
FIG. 22 is a structural block diagram of a memory system provided by an example of the present application.

FIG. 22 is a structural block diagram of a memory system provided by an example of the present application. As shown in FIG. 22, the memory system 2200 includes: one or more memories 2210, and, a controller 2220 coupled to the memories 2210 and configured to control the memories 2210.

Memory system 2200 may be a mobile phone, desktop computer, laptop computer, tablet computer, vehicle computer, game console, printer, positioning device, wearable electronic device, smart sensor, virtual reality (VR) device, augmented reality (AR) device or any other suitable electronic device having storage therein, in whole or in part.

In some examples, the memory system 2200 may include a host and a memory subsystem, and the memory subsystem has one or more memories 2210 and a controller 2220. The host may be a processor of the electronic device (for example, a Central Processing Unit (CPU)) or a System on Chip (SoC) (for example, an Application Processor (AP)). The host may be configured to send data to memory 2210. Alternatively, the host may be configured to receive data from memory 2210.

According to some examples, the controller 2220 is also coupled to the host. The controller 2220 may manage data stored in the memory 2210, and communicate with the host.

In some examples, the controller 2220 is designed to operate in a low duty-cycle environment, such as a Secure Digital (SD) card, Compact Flash (CF) card, Universal Serial Bus (USB) flash drive, or other media for use in electronic devices such as personal computers, digital cameras, mobile phones, and the like.

In some examples, the controller 2220 is designed to operate in a high duty-cycle environment solid-state disk (SSD) or an embedded Multi Media Card (eMMC) used as data storage for mobile devices such as smartphones, tablets, and laptops, and enterprise storage arrays.

The controller 2220 may be configured to control operations of the memory 2210, such as read, erase, and program operations. The controller 2220 may also be configured to manage various functions regarding data stored or to be stored in the memory 2210, including but not limited to bad block management, garbage collection, logical-to-physical address translation, wear leveling, and the like. In some examples, the controller 2220 is further configured to process error correction code (ECC) of data read from or written to the memory 2210.

Controller 2220 may also perform any other suitable functions, such as formatting memory 2210. The controller 2220 may communicate with external devices according to a specific communication protocol.

The controller 2220 and the one or more memories 2210 may be integrated into various types of storage devices, e.g., included in the same package (e.g., Universal Flash Storage (UFS) package or eMMC package). That is, the memory system 2200 can be implemented and packaged into different types of terminal electronic products.

In an example, the controller 2220 and a single memory 2210 can be integrated into a memory card. Memory cards can include PC cards (Personal Computer Memory Card International Association, PCMCIA), CF cards, Smart Media (SM) cards, memory sticks, multimedia cards (MMC, RS-MMC, MMCmicro), SD cards (SD, miniSD, microSD, SDHC), UFS, etc. The memory card may also include a memory card connector that couples the memory card with the host.

In an example, the controller 2220 and the plurality of memories 2210 may be integrated into a solid state drive (SSD). In some examples, at least one of the storage capacity or operating speed of the solid state drive is greater than that of the memory card.

The above-mentioned memory 2210 can be implemented as the memory as shown in FIG. 9, FIG. 17 or FIG. 19.

It can be understood that the control logic circuit in the memory 2210 can perform all or part of the operations in the scheme shown in FIG. 21 above.

Examples of the present application provide a computer system, which includes: a host, one or more memories as shown in FIG. 9, FIG. 17, or FIG. 19, and a controller coupled to the memory and configured to control the memory.

Examples of the present application provide a computer-readable storage medium storing instructions that, when run on a control logic circuit of a controller, implement a method of operating the memory as provided by the example shown in FIG. 21. In an example, the memory may be a memory as shown in any one of FIG. 9, FIG. 17 or FIG. 19.

The present application provides a memory, a method of operating a memory, a system and a storage medium, which are capable of reducing the overall size of the page buffer in the memory while the number of bit lines in the memory remains unchanged, and increasing the number of bit lines in the memory while the mold size of the memory remains unchanged. The technical solutions are set forth as follows.

In one aspect, it is provided a memory, comprising a peripheral circuit and a memory cell array; the peripheral circuit comprises a plurality of page buffers, and a logic control circuit coupled to the plurality of page buffers and configured to control the plurality of page buffers; each of the plurality of page buffers comprises a first bit line connection point, a second bit line connection point, a first switching component and a second switching component; the first bit line connection point and the second bit line connection point are to connect bit lines in the memory cell array; the first bit line connection point and the second bit line connection point are connected to a power terminal via independent precharge circuits respectively, and the first bit line connection point and the second bit line connection point are connected to a latch in the page buffer respectively; the precharge circuit is a circuit for precharging the bit lines by the page buffer; the first switching component connects the first bit line connection point and the second bit line connection point; and the second switching component is located on the precharge circuit corresponding to the second bit line connection point.

In an optional example, the control logic circuit is configured to: turn off the first switching component and turn on the second switching component when a program operation is performed through the page buffer; and turn on the first switching component and turn off the second switching component when a read operation is performed through the page buffer.

In an optional example, a third switching component is disposed between the first bit line connection point and a sensing latch in the page buffer, and the third switching component is located outside the precharge circuit corresponding to the first line connection point.

In an optional example, the control logic circuit is configured to turn off the third switching component when the program operation is performed through the page buffer; and turn on the third switching component when the read operation is performed through the page buffer.

In an optional example, the first bit line connection point is connected to N bit lines of 2×N bit lines comprised in the memory cell array, and the second bit line connection point is connected to other N bit lines of the 2×N bit lines, N being an integer greater than or equal to 2; and the 2×N bit lines are adjacent in sequence, and the bit lines connected to the first bit line connection point and the second bit line connection point respectively are interleaved in sequence.

In an optional example, the control logic circuit is configured to apply a bias voltage to a second bit line during the program operation performed through the page buffer on memory cells coupled to a first bit line, and wherein the first bit line and the second bit line are two adjacent bit lines of the 2×N bit lines.

In an optional example, the control logic circuit is configured to, when the program operation is performed on memory cells coupled to the 2×N bit lines through the page buffer: apply program pulse voltages to the 2×N bit lines in sequence according to an arrangement order of the 2×N bit lines via the first bit line connection point and the second bit line connection point, and wherein there is an overlap in time intervals of applying the program pulse voltages to two adjacent bit lines of the 2×N bit lines, such that during the program operation performed on memory cells coupled to a bit line, a bias voltage is applied to adjacent bit lines of the bit line.

In an optional example, for 4×N bit lines that are adjacent in sequence and connected to two page buffers in the memory cell array, an order in which the first 2×N bit lines of the 4×N bit lines are applied with the program pulse voltages in sequence is opposite to an order in which the latter 2×N bit lines of the 4×N bit lines are applied with the program pulse voltages in sequence.

On the other hand, it is provided a method of operating a memory, wherein the method is performed by a control logic circuit in a peripheral logic circuit of the memory. The memory is a memory as set forth in any of the above examples. The method comprises: turning off the first switching component and turning on the second switching component when a program operation is performed through the page buffer; and turning on the first switching component and turning off the second switching component when a read operation is performed through the page buffer.

In an optional example, a third switching component is disposed between the first bit line connection point and a sensing latch in the page buffer, and the third switching component is located outside the precharge circuit corresponding to the first line connection point.

In an optional example, the method further includes: turning off the third switching component when the program operation is performed through the page buffer; and turning on the third switching component when the read operation is performed through the page buffer.

In an optional example, the first bit line connection point is connected to N bit lines of 2×N bit lines comprised in the memory cell array, and the second bit line connection point is connected to other N bit lines of the 2×N bit lines, N being an integer greater than or equal to 2; and the 2×N bit lines are adjacent in sequence, and the bit lines connected to the first bit line connection point and the second bit line connection point respectively are interleaved in sequence.

In an optional example, the method further includes: applying a bias voltage to a second bit line during the program operation performed through the page buffer on memory cells coupled to a first bit line, and wherein the first bit line and the second bit line are two adjacent bit lines of the 2×N bit lines.

In an optional example, the applying a bias voltage to a second bit line during the program operation performed through the page buffer on memory cells coupled to a first bit line comprises: when the program operation is performed on memory cells coupled to the 2×N bit lines through the page buffer, applying program pulse voltages to the 2×N bit lines in sequence according to an arrangement order of the 2×N bit lines via the first bit line connection point and the second bit line connection point, and wherein there is an overlap in time intervals of applying the program pulse voltages to two adjacent bit lines of the 2×N bit lines, such that during the program operation performed on memory cells coupled to a bit line, a bias voltage is applied to adjacent bit lines of the bit line.

In an optional example, for 4×N bit lines that are adjacent in sequence and connected to two page buffers in the memory cell array, an order in which the first 2×N bit lines of the 4×N bit lines are applied with the program pulse voltages in sequence is opposite to an order in which the latter 2×N bit lines of the 4×N bit lines are applied with the program pulse voltages in sequence.

In another aspect, it is provided a memory system comprising: one or more memories as set forth in any of the above examples, and a controller coupled to the memories and configured to control the memories.

In another aspect, it is provided a memory system comprising: a host; one or more memories as set forth in any of the above examples; and a controller coupled to the memory and configured to control the memory.

On the other hand, it is provided a computer-readable storage medium storing instructions that, when run on a control logic circuit, implement the method of operating the memory as set forth in any of the above examples is implemented.

The technical solution provided by the present application can include the following beneficial effects:

For the plurality of page buffers in a peripheral circuit of a memory, each page buffer comprises two bit line connection points with independent precharge circuits, and the two bit line connection points are connected to bit lines in the memory cell array and a latch in the page buffer respectively. Meanwhile, the two bit line connection points are also connected through a first switching component, and a second switching component is also located on the precharge circuit of one of the bit line connection points. In the above scheme, the two bit line connection points in the page buffer can share a part of the circuit structure in the page buffer when the bit lines are respectively precharged during a program operation. For example, in a precharge stage during the program operation, the first switching component is turned off while the second switching component is turned on, so that the two bit line connection points precharge the bit line via their respective precharge circuits. During a read operation, the second switching component is turned off, and the reading of memory cells coupled to any of the two bit lines is enabled through the turning on of the first switching component, whereby the two bit line connection points share a sensing part of the circuit structure. With the above solution, two or more bit line connection points can be integrated into a page buffer and share a part of the circuit structure in the page buffer. There is no need to provide a page buffer for each bit line connection point, which can reduce the overall size of the page buffer in the memory while the number of bit lines in the memory remains unchanged, and increase the number of bit lines in the memory while the mold size of the memory remains unchanged, thereby improving storage capacity and performance.

In the present application, the terms "first" and "second" are used for descriptive purposes only, and should not be construed as indicating or implying relative importance. The term "at least one" means one or more, and the term "plurality" means two or more, unless otherwise clearly defined.

The term "at least one of" in this application is only an association relationship describing associated objects, which means that there may be three relationships. For example, at least one of A or B may mean: A alone, both A and B, and B alone. In addition, the character "/" herein indicates that the contextual objects are in an "or" relationship.

The above is only examples of the application, and are not intended to limit the application. Any modifications, equivalent replacements, improvements, etc. made within the spirit and principles of the application shall be included within the protection range of the application.

What is claimed is:

1. A memory comprising:
a memory cell array; and
a peripheral circuit comprising:
a plurality of page buffers, wherein each of the plurality of page buffers comprises a first bit line connection point, a second bit line connection point, a first switching component, and a second switching component; and
a logic control circuit coupled to the plurality of page buffers and configured to control the plurality of page buffers, wherein
the first bit line connection point and the second bit line connection point are to connect bit lines in the memory cell array, the first bit line connection point and the second bit line connection point are connected to a power terminal via independent precharge circuits, respectively, wherein the first bit line connection point and the second bit line connection point are connected to a latch in each page buffer of the plurality of page buffers, respectively, and a precharge circuit of the independent precharge circuits is a circuit for precharging the bit lines by the page buffer;

23 the first switching component connects the first bit line connection point and the second bit line connection point; and the second switching component is located on the precharge circuit corresponding to the second bit line connection point.

2. The memory of claim 1, wherein the logic control circuit is configured to:

turn off the first switching component and turn on the second switching component when a program operation is performed through the page buffer; and turn on the first switching component and turn off the second switching component when a read operation is performed through the page buffer.

3. The memory of claim 2, wherein a third switching component is disposed between the first bit line connection point and a sensing latch in the page buffer, and the third switching component is located outside the precharge circuit corresponding to the first bit line connection point.

4. The memory of claim 3, wherein the logic control circuit is configured to:

turn off the third switching component when the program operation is performed through the page buffer; and turn on the third switching component when the read operation is performed through the page buffer.

5. The memory of claim 1, wherein the first bit line connection point is connected to N bit lines of 2×N bit lines comprised in the memory cell array, and the second bit line connection point is connected to other N bit lines of the 2×N bit lines, N being an integer greater than or equal to 2; and the 2×N bit lines are adjacent in sequence, and the bit lines connected to the first bit line connection point and the second bit line connection point, respectively, are interleaved in sequence.

6. The memory of claim 5, wherein the logic control circuit is configured to apply a bias voltage to a second bit line during a program operation performed through the page buffer on memory cells coupled to a first bit line, wherein the first bit line and the second bit line are two adjacent bit lines of the 2×N bit lines.

7. The memory of claim 6, wherein the logic control circuit is configured to, when the program operation is performed on memory cells coupled to the 2×N bit lines through the page buffer, apply program pulse voltages to the 2×N bit lines in sequence according to an arrangement order of the 2×N bit lines via the first bit line connection point and the second bit line connection point, wherein there is an overlap in time intervals of applying the program pulse voltages to the two adjacent bit lines of the 2×N bit lines, such that, during the program operation performed on memory cells coupled to a bit line, the bias voltage is applied to adjacent bit lines of the bit line.

8. The memory of claim 7, wherein for 4×N bit lines that are adjacent in sequence and connected to two page buffers in the memory cell array, an order in which first 2×N bit lines of the 4×N bit lines are applied with the program pulse voltages in sequence is opposite to an order in which latter 2×N bit lines of the 4×N bit lines are applied with the program pulse voltages in sequence.

9. A method of operating a memory, wherein the method is performed by a control logic circuit in a peripheral logic circuit of the memory, the memory comprising:

a memory cell array; and the peripheral logic circuit comprising:

a plurality of page buffers, wherein each of the plurality of page buffers comprises a first bit line connection point, a second bit line connection point, a first switching component, and a second switching component; and a logic control circuit coupled to the plurality of page buffers and configured to control the plurality of page buffers, wherein the first bit line connection point and the second bit line connection point are to connect bit lines in the memory cell array, the first bit line connection point and the second bit line connection point are connected to a power terminal via independent precharge circuits, respectively, wherein the first bit line connection point and the second bit line connection point are connected to a latch in each page buffer of the plurality of page buffers, respectively, and a precharge circuit of the independent precharge circuits is a circuit for precharging the bit lines by the page buffer;

the first switching component connects the first bit line connection point and the second bit line connection point; and the second switching component is located on the precharge circuit corresponding to the second bit line connection point; and the method comprising:

turning off the first switching component and turning on the second switching component when a program operation is performed through the page buffer; and turning on the first switching component and turning off the second switching component when a read operation is performed through the page buffer.

10. The method of claim 9, wherein a third switching component is disposed between the first bit line connection point and a sensing latch in the page buffer, and the third switching component is located outside the precharge circuit corresponding to the first bit line connection point.

11. The method of claim 10, further comprises:

turning off the third switching component when the program operation is performed through the page buffer; and turning on the third switching component when the read operation is performed through the page buffer.

12. The method of claim 9, wherein the first bit line connection point is connected to N bit lines of 2×N bit lines comprised in the memory cell array, and the second bit line connection point is connected to other N bit lines of the 2×N bit lines, N being an integer greater than or equal to 2; and the 2×N bit lines are adjacent in sequence, and the bit lines connected to the first bit line connection point and the second bit line connection point, respectively, are interleaved in sequence.

13. The method of claim 12, further comprises applying a bias voltage to a second bit line during the program operation performed through the page buffer on memory cells coupled to a first bit line, wherein the first bit line and the second bit line are two adjacent bit lines of the 2×N bit lines.

14. The method of claim 13, wherein the applying the bias voltage to the second bit line during the program operation performed through the page buffer on the memory cells coupled to the first bit line comprises, when the program operation is performed on memory cells coupled to the 2×N bit lines through the page buffer, applying program pulse voltages to the 2×N bit lines in sequence according to an arrangement order of the 2×N bit lines via the first bit line connection point and the second bit line connection point, wherein there is an overlap in time intervals of applying the program pulse voltages to the two adjacent bit lines of the 2×N bit lines, such that, during the program operation performed on memory cells coupled to a bit line, the bias voltage is applied to adjacent bit lines of the bit line.

15. The method of claim 14, wherein for 4×N bit lines that are adjacent in sequence and connected to two page buffers in the memory cell array, an order in which first 2×N bit lines of the 4×N bit lines are applied with the program pulse voltages in sequence is opposite to an order in which latter 2×N bit lines of the 4×N bit lines are applied with the program pulse voltages in sequence.

16. A memory system comprising:
one or more memories, each of the memories comprises:
    a memory cell array; and
    a peripheral circuit comprising:
        a plurality of page buffers, wherein each of the plurality of page buffers comprises a first bit line connection point, a second bit line connection point, a first switching component, and a second switching component; and
        a logic control circuit coupled to the plurality of page buffers and configured to control the plurality of page buffers, wherein
            the first bit line connection point and the second bit line connection point are to connect bit lines in the memory cell array, the first bit line connection point and the second bit line connection point are connected to a power terminal via independent precharge circuits, respectively, wherein the first bit line connection point and the second bit line connection point are connected to a latch in each page buffer of the plurality of page buffers, respectively, and a precharge circuit of the independent precharge circuits is a circuit for precharging the bit lines by the page buffer;

the first switching component connects the first bit line connection point and the second bit line connection point; and
            the second switching component is located on the precharge circuit corresponding to the second bit line connection point; and
    a controller coupled to the memories and configured to control the memories.

17. The memory system of claim 16, wherein the logic control circuit is configured to:
turn off the first switching component and turn on the second switching component when a program operation is performed through the page buffer; and
turn on the first switching component and turn off the second switching component when a read operation is performed through the page buffer.

18. The memory system of claim 17, wherein a third switching component is disposed between the first bit line connection point and a sensing latch in the page buffer, and the third switching component is located outside the precharge circuit corresponding to the first bit line connection point.

19. The memory system of claim 18, wherein the logic control circuit is configured to:
turn off the third switching component when the program operation is performed through the page buffer; and
turn on the third switching component when the read operation is performed through the page buffer.

20. The memory system of claim 16, wherein
the first bit line connection point is connected to N bit lines of 2×N bit lines comprised in the memory cell array, and the second bit line connection point is connected to other N bit lines of the 2×N bit lines, N being an integer greater than or equal to 2; and
the 2×N bit lines are adjacent in sequence, and the bit lines connected to the first bit line connection point and the second bit line connection point, respectively, are interleaved in sequence.

* * * * *